United States Patent
Lee et al.

(10) Patent No.: US 11,650,363 B2
(45) Date of Patent: May 16, 2023

(54) LOW REFRACTIVE LAYER AND ELECTRONIC DEVICE INCLUDING THE SAME

(71) Applicant: Samsung Display Co., Ltd., Yongin-si (KR)

(72) Inventors: Taekjoon Lee, Hwaseong-si (KR); Young gu Kim, Yongin-si (KR); Sun-young Chang, Seoul (KR); Jongmin Ok, Hwaseong-si (KR); Hyelim Jang, Hwaseong-si (KR); Jin-soo Jung, Hwaseong-si (KR); Kyungseon Tak, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 155 days.

(21) Appl. No.: 16/459,105

(22) Filed: Jul. 1, 2019

(65) Prior Publication Data
US 2020/0041709 A1    Feb. 6, 2020

(30) Foreign Application Priority Data
Jul. 31, 2018    (KR) ........................ 10-2018-0088924

(51) Int. Cl.
*F21V 8/00*    (2006.01)
*G02F 1/1335*    (2006.01)
*G02F 1/13357*    (2006.01)

(52) U.S. Cl.
CPC ....... *G02B 6/005* (2013.01); *G02F 1/133528* (2013.01); *G02F 1/133617* (2013.01);
(Continued)

(58) Field of Classification Search
CPC .......... B32B 2457/20; B32B 2457/202; B32B 2457/203; B32B 2457/206;
(Continued)

(56) References Cited

U.S. PATENT DOCUMENTS

| 7,599,117 B2 | 10/2009 | Goto |
| 9,099,409 B2 | 8/2015 | Fujita |

(Continued)

FOREIGN PATENT DOCUMENTS

| CN | 103314063 A | 9/2013 |
| CN | 103718065 A | 4/2014 |

(Continued)

OTHER PUBLICATIONS

EPO Partial Search Report dated Dec. 16, 2019, for corresponding European Patent Application No. 19188682.9 (17 pages).

(Continued)

*Primary Examiner* — Eli D. Strah
(74) *Attorney, Agent, or Firm* — Lewis Roca Rothgerber Christie LLP

(57) ABSTRACT

A low refractive layer includes a plurality of hollow inorganic particles and a matrix between the hollow inorganic particles, and capable of exhibiting a good refractive index and improved durability by enhancing the weight ratio of the hollow inorganic particles to the matrix. An electronic device according to an embodiment of the inventive concept including the low refractive layer may exhibit improved reliability and good display quality.

30 Claims, 15 Drawing Sheets

(52) U.S. Cl.
CPC ..... *B32B 2457/20* (2013.01); *B32B 2457/202* (2013.01); *B32B 2457/206* (2013.01); *C09K 2323/00* (2020.08); *C09K 2323/03* (2020.08); *C09K 2323/031* (2020.08); *C09K 2323/033* (2020.08)

(58) Field of Classification Search
CPC ............ C09K 2323/00; C09K 2323/03; C09K 2323/031; C09K 2323/033; G02B 1/11; G02B 5/201; G02B 6/005; G02B 2207/107; G02F 1/1335; G02F 1/133502; G02F 1/133528; G02F 1/133607; G02F 1/133615; G02F 1/133617; G02F 1/133621; H01L 27/322; H01L 51/5268; H01L 2251/5369
See application file for complete search history.

(56) References Cited

U.S. PATENT DOCUMENTS

| | | | |
|---|---|---|---|
| 9,507,059 | B2 | 11/2016 | Shim et al. |
| 9,507,060 | B2 | 11/2016 | Shim et al. |
| 10,078,171 | B2 | 9/2018 | Lee |
| 10,268,063 | B2 | 4/2019 | Ju et al. |
| 10,466,390 | B2 | 11/2019 | Kobori |
| 11,275,199 | B2 | 3/2022 | Byun et al. |
| 2006/0216438 | A1* | 9/2006 | Nishimura ............. G02B 1/105 428/1.31 |
| 2012/0075557 | A1 | 3/2012 | Hong et al. |
| 2012/0113672 | A1* | 5/2012 | Dubrow ............... G02B 6/0061 362/602 |
| 2013/0299792 | A1 | 11/2013 | Park et al. |
| 2013/0335799 | A1* | 12/2013 | Yoon ................. G02F 1/133553 359/227 |
| 2013/0337161 | A1 | 12/2013 | Akimoto et al. |
| 2014/0153099 | A1 | 6/2014 | Ogane |
| 2014/0159025 | A1* | 6/2014 | Fukuoka ................. C01B 33/18 252/582 |
| 2015/0048348 | A1 | 2/2015 | Huang et al. |
| 2015/0194579 | A1 | 7/2015 | Chung et al. |
| 2016/0091757 | A1 | 3/2016 | Miki et al. |
| 2016/0223732 | A1 | 8/2016 | Jeon et al. |
| 2016/0250612 | A1 | 9/2016 | Oldenburg et al. |
| 2017/0031205 | A1* | 2/2017 | Lee ................... G02F 1/133555 |
| 2017/0114243 | A1* | 4/2017 | Katayama ................ B01J 13/14 |
| 2017/0219740 | A1 | 8/2017 | Kameno et al. |
| 2018/0045857 | A1* | 2/2018 | Hayashi .................... B32B 7/02 |
| 2018/0107028 | A1 | 4/2018 | Jung et al. |
| 2018/0171218 | A1* | 6/2018 | Low ....................... C09K 11/06 |
| 2019/0049639 | A1 | 2/2019 | Kanda et al. |
| 2019/0064602 | A1 | 2/2019 | Kim et al. |
| 2019/0121176 | A1 | 4/2019 | Lee et al. |
| 2019/0129079 | A1 | 5/2019 | Lee et al. |
| 2019/0219875 | A1 | 7/2019 | Jung et al. |
| 2020/0026135 | A1 | 1/2020 | Ki et al. |
| 2021/0055601 | A1* | 2/2021 | Kim .................. G02F 1/133504 |

FOREIGN PATENT DOCUMENTS

| | | | |
|---|---|---|---|
| CN | 109426042 | A | 3/2019 |
| CN | 109709710 | A | 5/2019 |
| EP | 3447572 | A1 | 2/2019 |
| EP | 3477369 | A1 | 5/2019 |
| JP | 2006-299248 | A | 11/2006 |
| JP | 2009-108262 | A | 5/2009 |
| JP | 2012-131928 | A | 7/2012 |
| JP | 2013-235141 | A | 11/2013 |
| JP | 2014-41169 | A | 3/2014 |
| JP | 2015-22072 | A | 2/2015 |
| JP | 2015-26418 | A | 2/2015 |
| JP | 2016-070949 | A | 5/2016 |
| JP | 2016-842267 | A | 5/2016 |
| JP | 2016-181474 | A | 10/2016 |
| JP | 2017-68248 | A | 4/2017 |
| JP | 2017-78747 | A | 4/2017 |
| JP | 6159385 | B2 | 7/2017 |
| KR | 10-2012-0097774 | A | 9/2012 |
| KR | 10-2013-0140122 | A | 12/2013 |
| KR | 10-1602470 | B1 | 3/2016 |
| KR | 10-2016-0084009 | A | 7/2016 |
| KR | 10-2016-0146275 | A | 12/2016 |
| KR | 10-2017-0046878 | A | 5/2017 |
| KR | 10-1871552 | B1 | 6/2018 |
| KR | 10-2018-0137627 | A | 12/2018 |
| KR | 10-2019-0016429 | A | 2/2019 |
| KR | 10-2019-0049419 | A | 5/2019 |
| KR | 10-2019-0118220 | A | 10/2019 |
| KR | 10-2019-0118698 | A | 10/2019 |
| TW | 201741689 | A | 12/2017 |
| WO | 2012/098923 | A1 | 7/2012 |

OTHER PUBLICATIONS

EPO Extended Search Report dated Apr. 17, 2020, for corresponding European Patent Application No. 19188682.9 (19 pages).
U.S. Office Action dated Mar. 18, 2021, issued in U.S. Appl. No. 16/881,362 (8 pages).

\* cited by examiner

LOW REFRACTIVE LAYER AND ELECTRONIC DEVICE INCLUDING THE SAME

CROSS-REFERENCE TO RELATED APPLICATION

This patent application claims priority to and the benefit of Korean Patent Application No. 10-2018-0088924, filed on Jul. 31, 2018, the entire content of which is hereby incorporated by reference.

BACKGROUND

1. Field

The present disclosure herein relates to a low refractive layer and an electronic device including the same, and more particularly, to a low refractive layer including hollow inorganic particles, and an electronic device including the same.

2. Description of the Related Art

Various electronic devices for providing image data in multimedia devices, such as a television, a mobile phone, a tablet computer, a navigation system, a game machine, and/or the like, are being developed. For example, in electronic devices having liquid crystal display elements, organic electroluminescence elements, and/or the like, quantum dots are utilized to improve display quality.

In order to further improve optical efficiency in such electronic devices utilizing quantum dots, an optical member employing a low refractive material is utilized, and in order to improve the reliability of the electronic devices, it is desirable to develop an optical member having improved durability while maintaining low refractive properties.

SUMMARY

An aspect according to embodiments of the present disclosure is directed toward a low refractive layer having improved strength while exhibiting good low refractive properties, by optimizing the weight ratio of hollow inorganic particles to a matrix.

An aspect according to embodiments of the present disclosure is also directed toward an electronic device having improved reliability and optical properties by including a low refractive layer with high strength.

According to an embodiment of the inventive concept, a low refractive layer includes a plurality of hollow inorganic particles, and a matrix configured to fill between the plurality of hollow inorganic particles, wherein a weight ratio of the plurality of hollow inorganic particles to the matrix is 4:6 to 7:3.

In an embodiment, each of the plurality of hollow inorganic particles may include a core filled with air and a shell surrounding the core, and the shell may be surface-treated with a coupling agent.

In an embodiment, the shell may include an inorganic layer defining the core, an organic layer surrounding an outer surface of the inorganic layer, and a surface treatment layer on an outer surface of the organic layer and including the coupling agent.

In an embodiment, the coupling agent may include a first end coupled to the organic layer, and a second end coupled to the matrix.

In an embodiment, the first end may be an acrylate group and the second end may be a trihydroxysilyl group.

In an embodiment, the coupling agent may be represented by Formula 1 below.

Formula 1 below

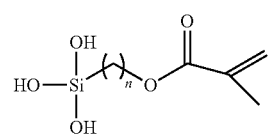

Formula 1

In Formula 1, n is an integer of 1 to 5.

In an embodiment, the shell may include at least one selected from the group consisting of $SiO_2$, $MgF_2$, and $Fe_3O_4$.

In an embodiment, the shell may have a thickness of 7 nm to 10 nm.

In an embodiment, each of the plurality of hollow inorganic particles may have an average diameter of 20 nm to 200 nm.

In an embodiment, the matrix may include at least one selected from the group consisting of an acrylic-based polymer, a silicone-based polymer, a urethane-based polymer, and an imide-based polymer.

In an embodiment, the low refractive layer may have a transmittance of 95% or greater at a wavelength of 400 nm to 700 nm and a refractive index of 1.1 to 1.5 at a wavelength of 632 nm.

In an embodiment of the inventive concept, an electronic device includes a light source configured to provide a first light, a color converter on the light source, and including a first converter configured to wavelength-convert the first light into a second light and a second converter configured to wavelength-convert the first light into a third light, and a low refractive layer on the light source and on at least one of an upper portion and a lower portion of the color converter, wherein the low refractive layer includes a plurality of hollow inorganic particles and a matrix configured to fill between the plurality of hollow inorganic particles, and a weight ratio of the plurality of hollow inorganic particles to the matrix is 4:6 to 7:3.

In an embodiment, each of the plurality of hollow inorganic particles may include a core filled with air and a shell surrounding the core, and the shell may be surface-treated with a coupling agent.

In an embodiment, the first light may be blue light, and the first converter may include a first quantum dot configured to covert the blue light into green light, and the second converter may include a second quantum dot configured to convert the blue light into red light.

In an embodiment, the electronic device may further include a display element on the color converter.

In an embodiment, the display element may be a liquid crystal display.

In an embodiment, the light source may include a guide panel, and a light source unit on at least one side of the guide panel, and the low refractive layer may be between the guide panel and the color converter.

In an embodiment, the low refractive layer may be directly on the guide panel.

In an embodiment, the electronic device may further include a barrier layer on at least one of an upper surface and a lower surface of the color converter.

In an embodiment, the color converter may include a plurality of color conversion parts spaced apart from each other on a plane, and the plurality of color conversion parts may have a first color conversion part having the first converter, a second color conversion part having the second converter, and a third color conversion part configured to transmit the first light.

In an embodiment, the color converter may further include a light blocking unit between the first, second and third color conversion parts which are spaced apart from each other.

In an embodiment, the electronic device may further include a reflection layer on at least one of an upper portion and a lower portion of the plurality of color conversion parts, and configured to transmit the first light and reflect the second light and the third light.

In an embodiment, the low refractive layer may be between the reflection layer and the plurality of color conversion parts, and configured to cover the plurality of color conversion parts.

In an embodiment, the reflection layer may be between the low refractive layer and the plurality of color conversion parts, and configured to cover the plurality of color conversion parts.

In an embodiment, the color converter may further include a barrier layer on at least one of an upper portion and a lower portion of the plurality of color conversion parts.

In an embodiment, the barrier layer may be between the low refractive layer and the plurality of color conversion parts, and configured to cover the plurality of color conversion parts.

In an embodiment, the color converter may further include an optical filter layer configured to transmit at least one of the second light and the third light.

In an embodiment, the optical filter layer may include a first optical filter layer on the first color conversion part, and a second optical filter layer on the second color conversion part.

In an embodiment, the first optical filter layer may be configured to transmit green light, and the second optical filter layer may be configured to transmit red light.

In an embodiment, the electronic device may further include a first base substrate and a second base substrate on the light source, the second base substrate facing the first base substrate, and a liquid crystal layer between the first base substrate and the second base substrate, wherein the color converter may be between the liquid crystal layer and the second base substrate.

In an embodiment, the low refractive layer may be between the liquid crystal layer and the color converter, or between the color converter and the second base substrate.

In an embodiment, the electronic device may further include a first polarizing layer between the light source and the first base substrate, or between the first base substrate and the liquid crystal layer, and a second polarizing layer between the liquid crystal layer and the second base substrate.

In an embodiment, the light source may include an organic electroluminescence element.

In an embodiment, the color converter may further include a dam configured to separate the plurality of color conversion parts from each other, the dam being between adjacent color conversion parts from among the plurality of color conversion parts.

In an embodiment, the color converter may further include a color filter layer on the plurality of color conversion parts, and the color filter layer may include a plurality of filters configured to emit light of different colors, and a light blocking unit configured to separate the plurality of filters from each other, the light blocking unit being between adjacent filters from among the plurality of filters.

In an embodiment of the inventive concept, an electronic device includes a display element, a guide panel on a lower portion of the display element, a light source adjacent to at least one side surface of the guide panel, a color converter between the guide panel and the display element, and a low refractive layer between the guide panel and the color converter, wherein the low refractive layer includes a plurality of hollow inorganic particles and a matrix configured to fill between the plurality of hollow inorganic particles, and a weight ratio of the plurality of hollow inorganic particles to the matrix is 4:6 to 7:3.

In an embodiment, the light source may include a light emitting element configured to emit blue light, and the color converter may include a green quantum dot configured to be excited by the blue light to emit green light and a red quantum dot configured to be excited by at least one of the blue light and the green light to emit red light.

In an embodiment, the plurality of hollow inorganic particles may include a core filled with air and a shell defining the core, and the shell may include a surface treatment layer including a coupling agent.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept.

In the drawings.

DETAILED DESCRIPTION

Figure 1:
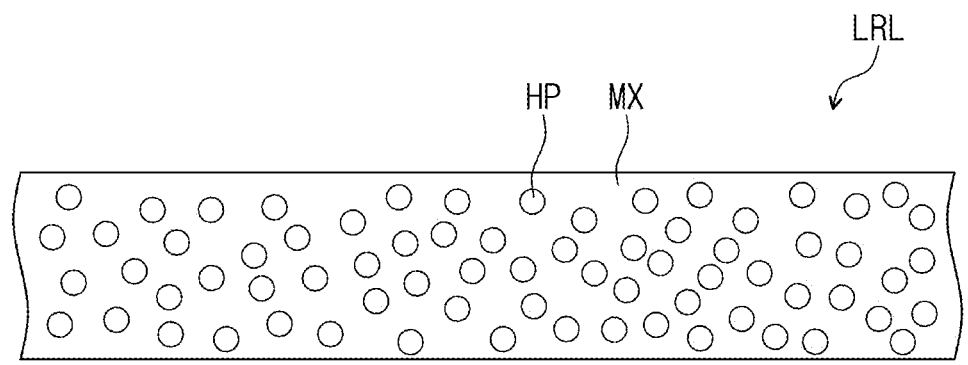
FIG. 1 is a cross-sectional view of a low refractive layer according to an embodiment of the inventive concept.

The inventive concept may be modified in many alternate forms, and thus specific embodiments will be exemplified in the drawings and described in more detail. It should be understood, however, that it is not intended to limit the inventive concept to the particular forms disclosed, but rather, is intended to cover all modifications, equivalents, and alternatives falling within the spirit and scope of the invention, and equivalents thereof.

In the present disclosure, when an element (or a region, a layer, a section, etc.) is referred to as being "on," "connected to," or "coupled to" another element, it may be directly on, connected to, or coupled to the other element or intervening elements or layers may be present.

Like reference numerals denote like elements. Also, in the accompanying drawings, thicknesses, ratios, and sizes of elements may be exaggerated for clarity and descriptive purposes.

The term "and/or," includes any and all combinations of one or more of the associated listed items.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. The terms of a singular form may include plural forms unless the context clearly indicates otherwise.

In addition, terms such as "below," "lower," "above," "upper," and the like, may be used herein for descriptive purposes, and thereby to describe one element or feature's relationship to another element(s) or feature(s) as illustrated in the drawings. Spatially relative terms are intended to encompass different orientations of an apparatus in use, operation, and/or manufacture in addition to the orientation depicted in the drawings.

Unless otherwise defined, all terms (including technical and scientific terms) used herein have the same meaning as commonly understood by one of ordinary skill in the art to which the inventive concept belongs. Also, the terms defined in the dictionary should be interpreted as having a meaning that is consistent with the meaning in the context of the related art, and, unless clearly defined herein, should not be understood in an ideally or excessively formal way.

It should be understood that the terms "comprise", "include" or "have," when used in this specification, specify the presence of stated features, integers, steps, operations, elements, components, and/or groups thereof, but do not preclude the presence or addition of one or more other features, integers, steps, operations, elements, components, and/or groups thereof. Expressions such as "at least one of", "one of" or "selected from" when preceding a list of elements, modify the entire list of elements and do not modify the individual elements of the list. Further, the use of "may" when describing embodiments of the present invention refers to "one or more embodiments of the present invention."

Hereinafter, a low refractive layer according to an embodiment of the inventive concept and an electronic device including the same according to an embodiment of the inventive concept will be described in more detail with reference to the accompanying drawings.

FIG. 1 is a cross-sectional view of a low refractive layer according to an embodiment of the inventive concept. A low refractive layer LRL shown in FIG. 1 may be included in an electronic device DS (see FIG. 7) according to an embodiment of the inventive concept to be described later.

The low refractive layer LRL includes a plurality of hollow inorganic particles HP and a matrix part MX (e.g., a matrix MX). The matrix part MX may fill between the hollow inorganic particles HP.

The matrix part MX may include a polymer material. The matrix part MX may include at least one of an acrylic-based polymer, a silicone-based polymer, a urethane-based polymer, or an imide-based polymer. For example, the matrix part MX may include any one polymer material selected from an acrylic-based polymer, a silicone-based polymer, a urethane-based polymer, and an imide-based polymer, or combinations of a plurality of polymer materials selected from the same.

The matrix part MX may be formed of an acrylic-based resin, a silicone-based resin, a urethane-based resin, and/or an imide-based resin. The matrix part MX may be provided by mixing a polymer resin with the hollow inorganic particles HP, and then solidifying the polymer resin in a high-temperature process or in an ultraviolet treatment process.

The low refractive layer LRL according to an embodiment of the inventive concept includes a plurality of the hollow inorganic particles HP and the matrix part MX, and the weight ratio of the hollow inorganic particles HP to the matrix part MX may be 4:6 to 7:3. That is, when the total weight of the low refractive layer LRL according to an embodiment of the inventive concept is 10 (e.g., 10 parts), the hollow inorganic particles HP may be included in the range of 4 to 7 (e.g., 4 to 7 parts) based on the total weight of the low refractive layer LRL of 10 (e.g., 10 parts).

When the total weight of the low refractive layer LRL is 10 and the weight of the hollow inorganic particles HP is less than 4 based on the total weight of 10, the refractive index of the low refractive layer is increased so that the optical extraction function of the low refractive layer LRL may be deteriorated in relation to other members. In addition, when the weight of the hollow inorganic particles HP is greater than 7 based on the total weight of the low refractive layer LRL of 10, the amount of the matrix part MX in the low refractive layer LRL is reduced, therefore, voids and the like (due to insufficient filling between the hollow inorganic particles HP by the matrix part MX) may appear so that the mechanical strength of the low refractive layer LRL may be deteriorated. In the present specification, the voids of the low refractive layer LRL may represent a portion that is not filled with the hollow inorganic particles (HP) or the matrix part (MX).

Figure 2:
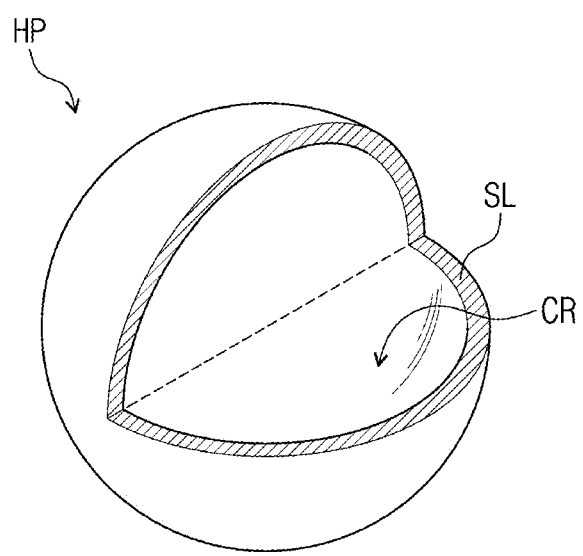
FIG. 2 is a cutaway view of a hollow inorganic particle according to an embodiment of the inventive concept.

The hollow inorganic particles HP may be in the form of a core shell. FIG. 2 is a cutaway view of a portion of the hollow inorganic particle HP included in the low refractive layer LRL according to an embodiment of the inventive concept. FIG. 2 is a drawing for describing the inside of the hollow inorganic particle HP with a portion of the hollow inorganic particle HP being cut away. In an embodiment, the hollow inorganic particle HP may be, for example, spherical.

Each of the hollow inorganic particles HP may include a core part (e.g., a core) CR, and a shell part (e.g., a shell) SL surrounding the core part CR. The core part CR may be defined by the shell part SL. The shell part SL may be a layer formed of an inorganic material. The shell part SL may include at least one of $SiO_2$, $MgF_2$, or $Fe_3O_4$. For example, in the low refractive layer LRL of an embodiment, the hollow inorganic particle HP may be hollow silica.

The core part CR may be filled with air. However, embodiments of the inventive concept are not limited thereto, and the core part CR in the hollow inorganic particle HP may be filled with a liquid or gas having low refractive properties.

The shell part SL may be surface-treated with a coupling agent. That is, an outer surface of the shell part SL, i.e., the surface in contact with the matrix part MX, may be treated with the coupling agent.

Figure 3:
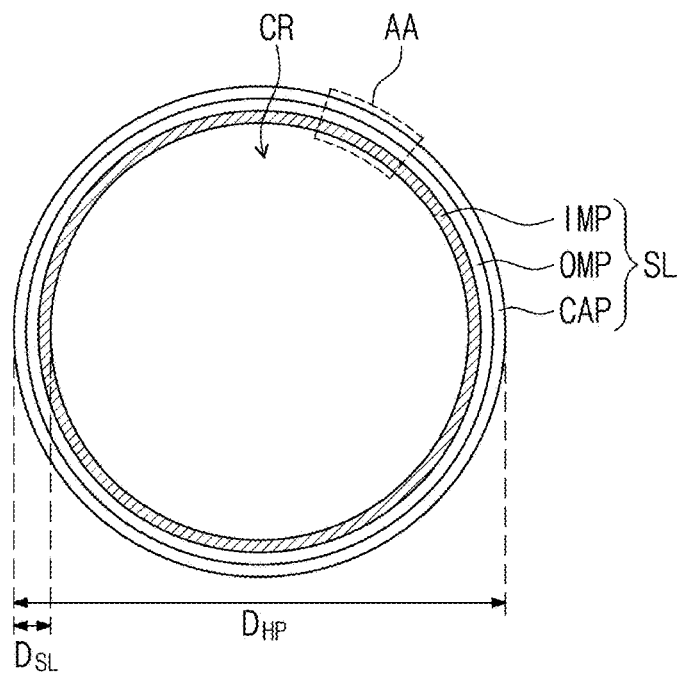
FIG. 3 is a cross-sectional view of a hollow inorganic particle according to an embodiment of the inventive concept.
Figure 4:
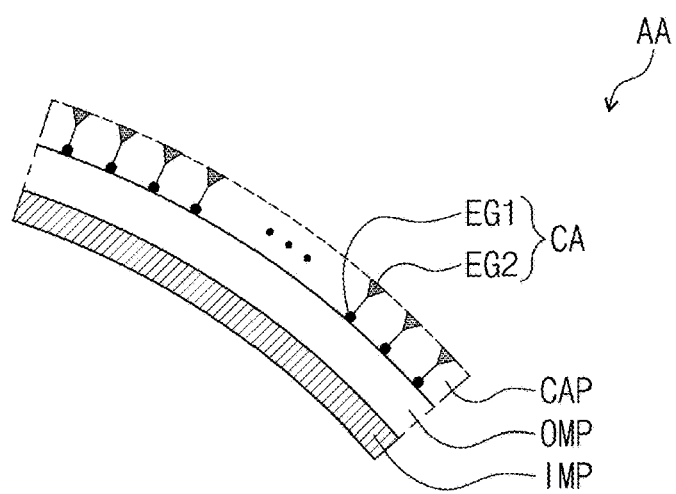
FIG. 4 is a drawing corresponding to the AA region of FIG. 3.

FIG. 3 is a cross-sectional view of the hollow inorganic particle HP according to an embodiment of the inventive concept. FIG. 4 is a drawing showing a portion of a cross-section of the hollow inorganic particle HP in more detail. Referring to FIG. 3 and FIG. 4, the shell part SL of the hollow inorganic particle HP may include an inorganic layer IMP, an organic layer OMP, and a surface treatment layer CAP.

In the hollow inorganic particle HP, the inorganic layer IMP may define the core part CR. The inorganic layer IMP may include at least one of $SiO_2$, $MgF_2$, or $Fe_3O_4$. The organic layer OMP may surround an outer surface of the inorganic layer IMP. The organic layer OMP may be disposed outside of the inorganic layer IMP such that the hollow inorganic particles HP may be dispersed and arranged in the matrix part MX. That is, the organic layer OMP allows the hollow inorganic particles HP to be uniformly dispersed in the matrix part MX without being clustered together.

In an embodiment, the shell part SL of the hollow inorganic particle HP may include the surface treatment layer CAP. The surface treatment layer CAP may be disposed on an outer surface of the organic layer OMP. The outer surface of the organic layer OMP may be adjacent to the matrix part MX. The surface treatment layer CAP may surround the outer surface of the organic layer OMP. The surface treatment layer CAP may include a coupling agent CA. The surface treatment layer CAP may be a layer formed by coating the organic layer OMP with the coupling agent CA.

The coupling agent CA may include a first end EG1 coupled to the organic layer OMP, and a second end EG2 coupled to the matrix part MX. The first end EG1 may be chemically coupled to the organic layer OMP, and the second end EG2 may be chemically coupled to the matrix part MX. In an embodiment, the first end EG1 of the coupling agent CA may be an acrylate group, and the second end EG2 may be a trihydroxysilyl group.

In the hollow inorganic particle HP according to an embodiment of the inventive concept, the coupling agent CA may be represented by Formula 1 below.

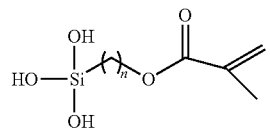

Formula 1

In Formula 1, n may be an integer of 1 to 5. For example, in the hollow inorganic particle HP according to an embodiment of the inventive concept, the coupling agent CA may be 2-(trihydroxysilyl)ethyl methacrylate, and/or the like, but embodiments of the inventive concept are not limited thereto.

The average diameter of the hollow inorganic particles HP may be 20 nm to 200 nm. Referring to FIG. 3, a diameter $D_{HP}$ of the hollow inorganic particles HP may be the outermost diameter of the shell part SL. By adjusting the average diameter of the hollow inorganic particles HP to be 20 nm to 200 nm, the thickness and the refractive index of the low refractive layer LRL may be enhanced (e.g., optimized).

In the hollow inorganic particle HP, a thickness $D_{SL}$ of the shell part SL may be 7 nm to 10 nm. By adjusting the thickness $D_{SL}$ of the shell part SL to be 7 nm to 10 nm, the strength of the hollow inorganic particles HP may be maintained while increasing (e.g., maximizing) the volume of the core part CR.

The hollow inorganic particles HP may adjust the refractive index of the low refractive layer LRL by filling the core part CR with air, or by including a low refractive material in the core part CR. For example, the refractive index of the hollow inorganic particles HP may be 1.0 to 1.3.

Also, the low refractive layer LRL of an embodiment has a transmittance of 95% or greater in a visible light region having a wavelength range of 400 nm to 700 nm, and a refractive index of 1.1 to 1.5 at a wavelength of 632 nm.

The low refractive layer LRL of an embodiment of the inventive concept may exhibit improved strength by enhancing (e.g., optimizing) the weight ratio of the hollow inorganic particles HP to the matrix part MX. In addition, the low refractive layer LRL of an embodiment of the inventive concept may exhibit high mechanical strength by adjusting the weight ratio of the hollow inorganic particles HP to the matrix part MX to be 4:6 to 7:3, and surface-treating the hollow inorganic particles HP with the coupling agent CA so as to increase the coupling force with the matrix part MX and to reduce or minimize void generation.

Figure 5A:
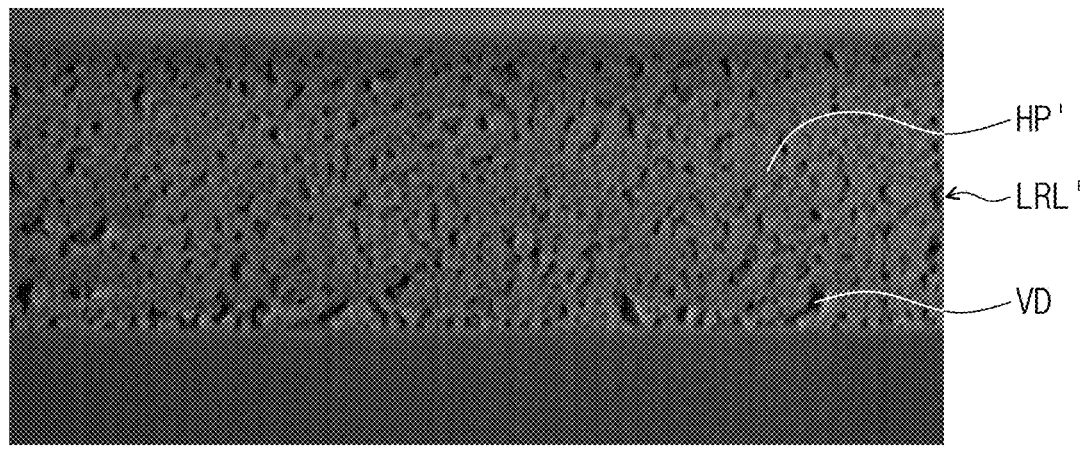
FIG. 5A is an image showing a cross-section of a low refractive layer of a comparative example according to an embodiment of the inventive concept.
Figure 5B:
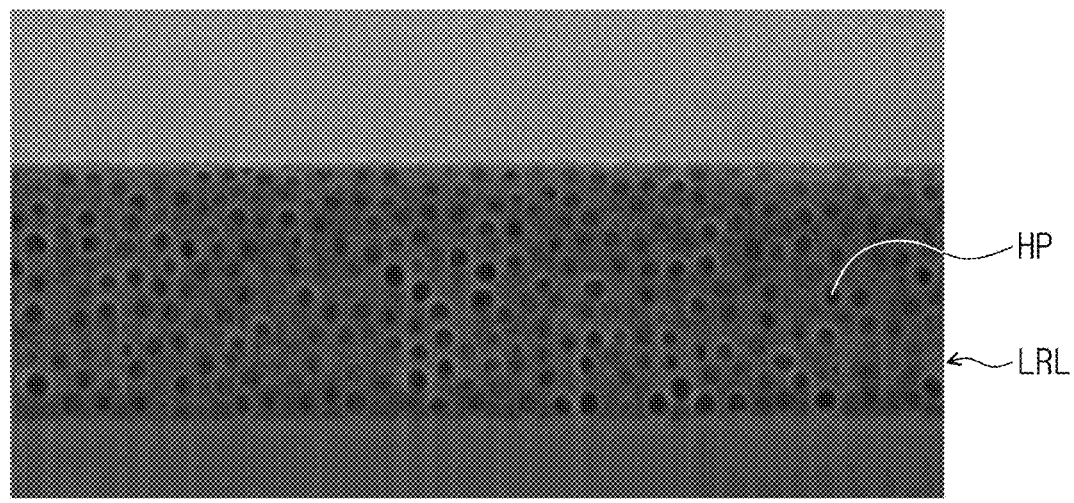
FIG. 5B is an image showing a cross-section of a low refractive layer of an example according to an embodiment of the inventive concept.

FIG. 5A and FIG. 5B are images showing a cross-sectional state (e.g., cross-sectional view) of a low refractive layer according to a comparative example and an example respectively. A low refractive layer LRL' of the comparative example of FIG. 5A has a weight ratio of hollow inorganic particles to a matrix part of 9:1, and because the matrix part fails to sufficiently fill between the hollow inorganic particles, there are many voids VD.

Compared with the same, the low refractive layer LRL of the example of FIG. 5B (e.g., utilizing the same hollow inorganic particles and the same matrix material as the comparative example of FIG. 5A) has a weight ratio of hollow inorganic particles to a matrix part of 6:4, and there are no voids VD observed as in the comparative example. That is, the low refractive layer LRL of an embodiment of the inventive concept has a desirable (e.g., optimizes the) weight ratio of the hollow inorganic particles HP to the matrix part MX to reduce or minimize void generation, thereby exhibiting improved strength of a film.

Figure 6:
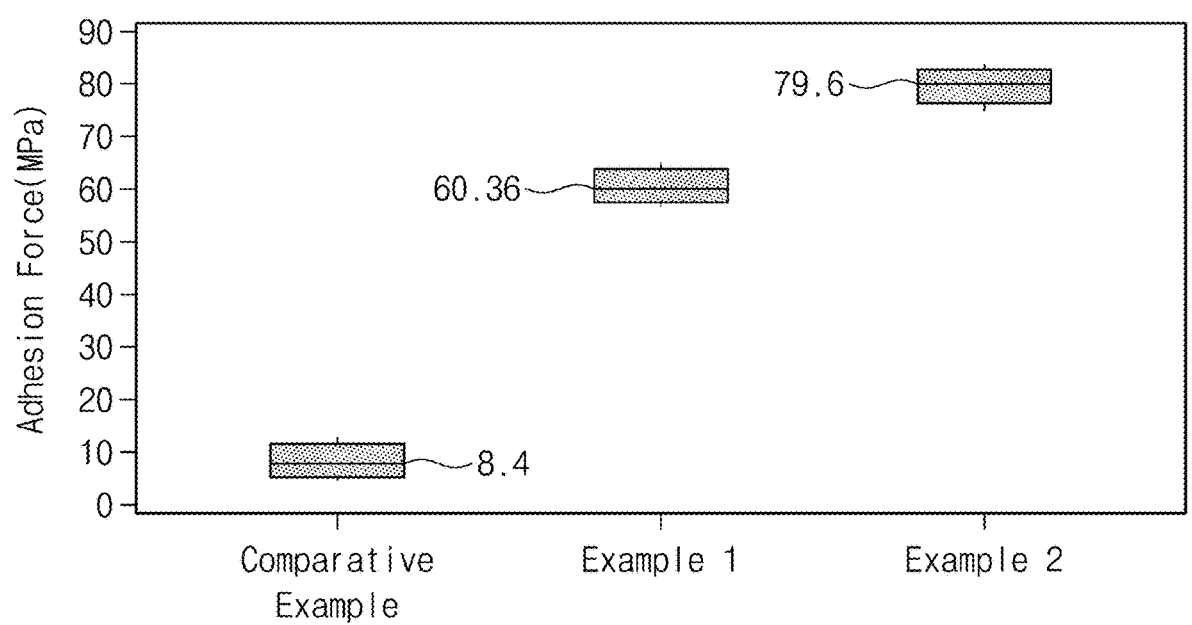
FIG. 6 is a graph showing the results of evaluating durability of a low refractive layer in a comparative example and Examples 1 and 2 according to an embodiment of the inventive concept.

FIG. 6 shows the results of adhesion force values measured by a strength test (e.g., Stud Pull Test) when a low refractive layer according to a Comparative Example and a low refractive layer according to Examples 1 and 2 were respectively utilized. Samples utilized in the test were prepared by laminating a glass substrate/a low refraction layer/a siloxane inorganic layer, and the strength of the low refractive layer in the Comparative Example and Examples 1-2 were relatively compared. The Comparative Example was prepared by utilizing a low refractive layer in which the ratio of hollow inorganic particles to a matrix part was 9:1, and a shell part of the hollow inorganic particles included only an inorganic layer and an organic layer. Example 1 was prepared similarly to the Comparative Example except for utilizing a low refractive layer in which the ratio of hollow inorganic particles to a matrix part was 6:4. Example 2 was prepared by utilizing a low refractive layer in which the ratio of hollow inorganic particles to a matrix part was 6:4, and a shell part of the hollow inorganic particles included an inorganic layer, an organic layer, and a surface treatment layer disposed on the outside of the organic layer.

Referring to the results shown in FIG. 6, higher adhesion force was observed in Examples 1-2 than in the Comparative Example. In the Comparative Example, the average value of adhesion force was about 8.4 MPa, and in Example 1, the average value of adhesion force was about 60.36 MPa. In Example 2, the average value of adhesion force was about 79.6 MPa. That is, from the adhesion force values of the Comparative Example and Examples 1-2, it can be confirmed that the low refractive layer of an embodiment of the inventive concept has excellent strength. In addition, in the case of Example 2, hollow inorganic particles having a surface treatment layer were included to increase the coupling strength between the matrix part and the hollow inorganic particles, so that the adhesion force value was higher when compared with that of Example 1.

A low refractive layer of an embodiment of the inventive concept enhances (e.g., optimizes) the weight ratio of hollow inorganic particles to a matrix part such that spaces between the hollow inorganic particles are sufficiently filled by the matrix part so as to reduce or minimize void generation. Also, the low refractive layer of an embodiment of the inventive concept surface-treats the hollow inorganic particles with a coupling agent so as to increase the coupling force with the matrix part. Thereby, the low refractive layer of an embodiment of the inventive concept exhibited improved internal strength while having a good low refractive index.

Hereinafter, an electronic device according to an embodiment of the inventive concept will be described with reference to accompanying drawings.

Figure 7:
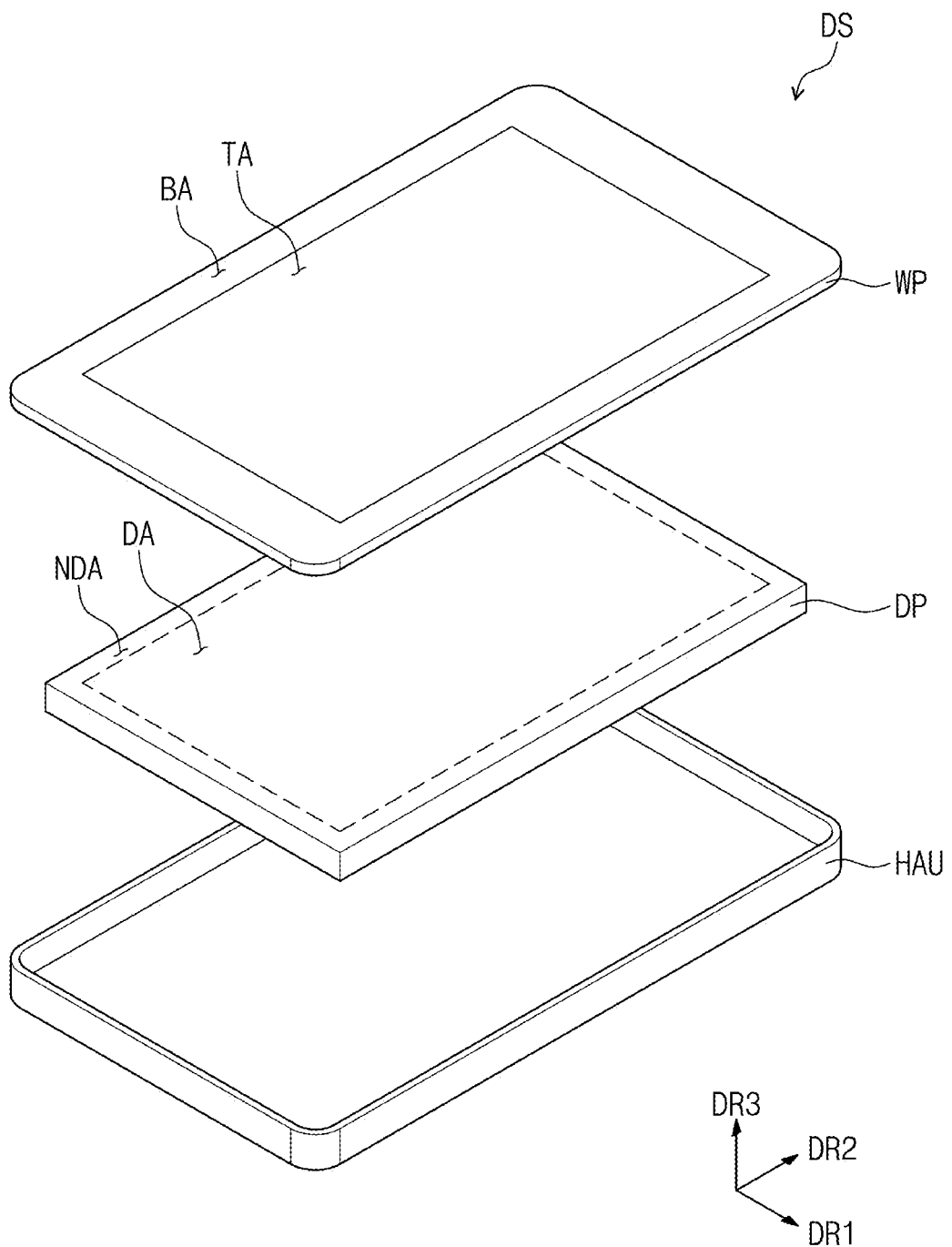
FIG. 7 is an exploded perspective view of an electronic device according to an embodiment of the inventive concept.

FIG. 7 is an exploded perspective view of an electronic device DS according to an embodiment of the inventive concept;

The electronic device DS of an embodiment may include various elements, such as a display element (e.g., a display), a touch element, and/or a detection element, activated according to an electric signal. The electronic device DS of an embodiment may include a window member WP, a display member DP, and a housing member HAU.

In an embodiment, the electronic device DS includes a display element, and may be a display device providing images. For example, in an embodiment, the electronic device DS may be a liquid crystal display device or an organic electroluminescence element.

Here, in FIG. 7 and other figures, a first direction axis DR1 to a third direction axis DR3 are shown. Direction axes described in the present specification are relative, and for convenience of explanation, the direction of the third direction axis DR3 may be defined as the direction in which an image is provided to a user. In describing the example embodiments, the terms such as an "upper surface," an "upper portion," a "lower surface," or a "lower portion" refer to the relative position of surfaces or portions along the third direction axis DR3 as shown in FIG. 7. In addition, the first direction axis DR1 and a second direction axis DR2 cross (e.g., are orthogonal to) each other, and the third direction axis DR3 may be normal with respect to a plane defined by the first direction axis DR1 and the second direction axis DR2. In FIG. 7, the plane defined by the first direction axis DR1 and the second direction axis DR2 may be a display surface on which an image is provided.

In the electronic device DS of an embodiment, the window member WP may be disposed on the display member DP. The window member WP may be made of a material including glass, sapphire, or plastic. The window member WP includes a light transmitting region TA, which transmits an image provided from the display member DP, and a light blocking region BA, which is adjacent to the light transmitting region TA and in which an image is not transmitted. The light transmitting region TA may be disposed at the center of the electronic device DS on the plane defined by the first direction axis DR1 and the second direction axis DR2. The light blocking region BA may be disposed on the periphery of the light transmitting region TA and has a shape of a frame surrounding the light transmitting region TA. However, the inventive concept is not limited thereto, and according to another embodiment of the inventive concept, the window member WP may include only the light transmitting region TA, in which case the light blocking region BA may be omitted. In addition, the light blocking region BA may be disposed on at least one side of the light transmitting region TA.

In one embodiment, unlike the one shown in FIG. 7, in the electronic device DS, the window member WP may be omitted.

In the electronic device DS of an embodiment, the display member DP may be disposed on a lower portion (e.g., on the bottom) of the window member WP. The display member DP may include a liquid crystal display element or an organic electroluminescence element.

On a plane, a surface of the display member DP, i.e., the surface on which an image is displayed, is defined as a display surface. The display surface includes a display region DA on which an image is displayed, and a non-display region NDA on which an image is not displayed. The display region DA may be defined at the center of the display member DP on the plane and may overlap the light transmitting region TA of the window member WP.

The housing member HAU may be disposed at a lower portion (e.g., on the bottom) of the display member DP to house the display member DP. The housing member HAU may be disposed to cover the display member DP such that the upper surface of the display member DP, which is the display surface, is to be exposed. The housing member HAU may cover a side surface and the lower surface of the display member DP such that the entire upper surface thereof is to be exposed. Alternatively, the housing member HAU may cover a portion of the upper surface as well as the side surface and the lower surface of the display member DP.

The electronic device DS of an embodiment may include the low refractive layer LRL of an embodiment described with reference to FIGS. 1-6. The electronic device DS of an embodiment may include a light source member, a color conversion member disposed on the light source member, and the low refractive layer LRL of an embodiment disposed between the light source member and the color conversion member. The low refractive layer LRL included in the electronic device DS of an embodiment may convert (e.g., redirect) a path of light. For example, the low refractive layer LRL may be utilized to extract light in relation to adjacent layers or members.

Figure 8:
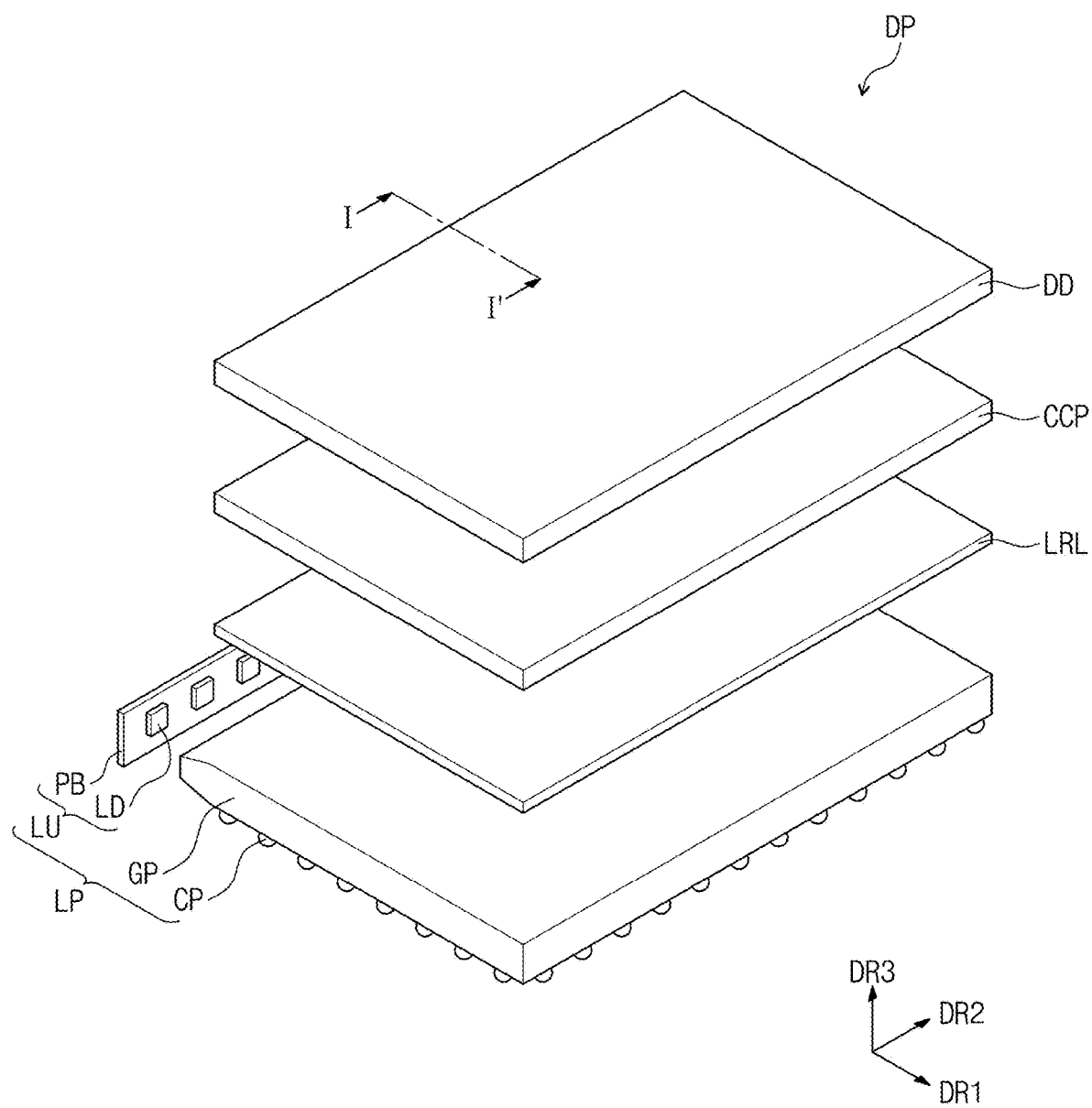
FIG. 8 is an exploded perspective view of a display member according to an embodiment of the inventive concept.
Figure 9:
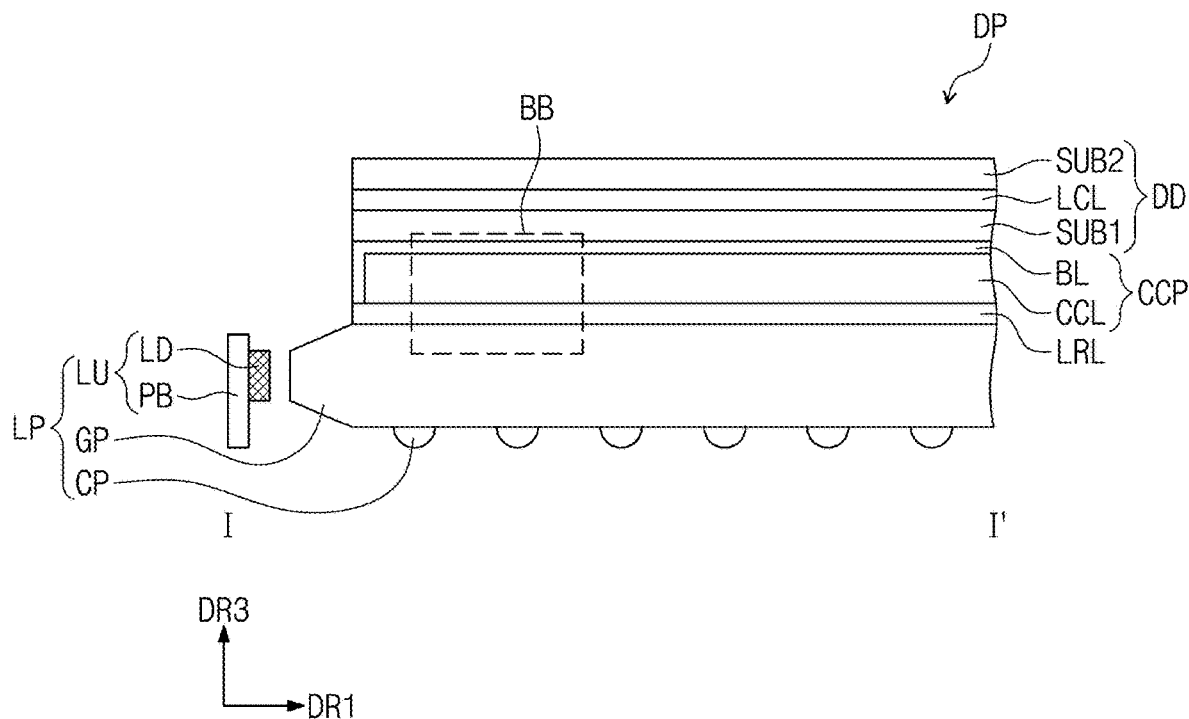
FIG. 9 is a cross-sectional view taken along the line I-I' shown in FIG. 8.
Figure 10:
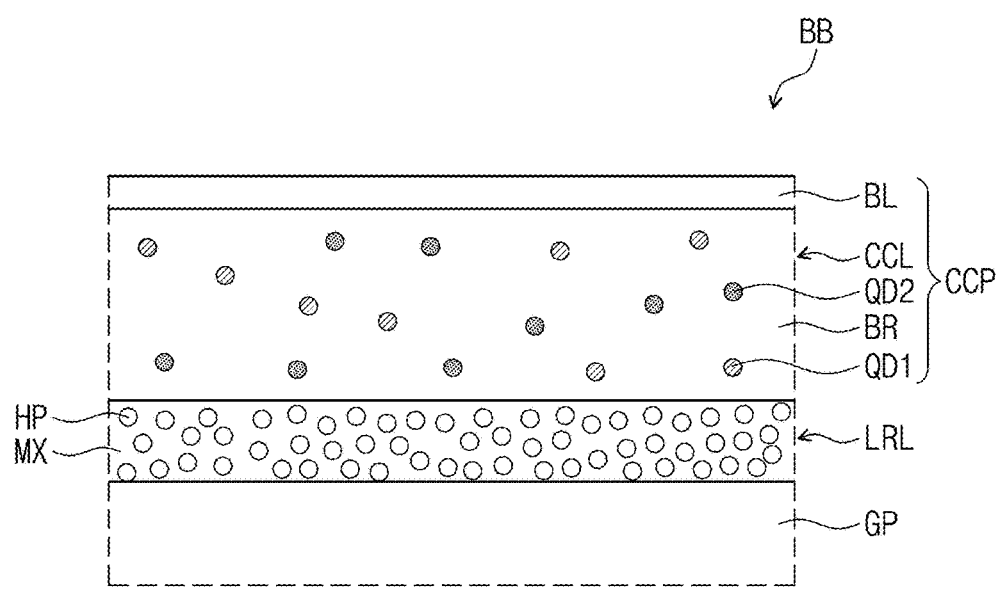
FIG. 10 is a cross-sectional view showing the BB region of FIG. 9.

FIG. 8 is an exploded perspective view of a display member included in an electronic device of an embodiment of the inventive concept. FIGS. 9 and 10 are cross-sectional views showing a portion of a display member according to an embodiment of the inventive concept. FIG. 9 is a cross-sectional view taken along the line I-I' shown in FIG. 8, and FIG. 10 a cross-sectional view showing the BB region of FIG. 9.

The display member DP according to an embodiment, which is included in the electronic device DP (see FIG. 7) of an embodiment, may include a light source member (e.g., a light source) LP and a display element (e.g., a display) DD. The display member DP may include a color conversion member (e.g., a color converter) CCP disposed on the light source member LP and the low refractive layer LRL disposed between the light source member LP and the color conversion member CCP.

The light source member LP may include a light source unit LU and a guide panel GP.

The light source unit LU may provide a first light. The light source unit LU may include a circuit board PB and a light emitting element LD disposed (e.g., mounted) on the circuit board PB.

The circuit board PB may provide power to the mounted light emitting element LD. For example, the circuit board PB may provide a dimming signal and a driving voltage to the mounted light emitting element LD. The circuit board PB may include at least one insulating layer and at least one circuit layer. For example, the circuit board PB may be a metal core printed circuit board.

Also, on the circuit board PB, a plurality of light emitting elements LD may be disposed. The light emitting elements LD generate light in response to a voltage provided from the circuit board PB, and each light emitting element LD may have a structure in which an n-type semiconductor layer, an active layer, and a p-type semiconductor layer are sequentially laminated. Each light emitting element LD may include a light emitting diode for generating light. When the driving voltage is applied, electrons and holes are recombined while moving in the light emitting diode.

The plurality of light emitting elements LD may emit light of the same wavelength range. Alternatively, the light source unit LU may include a plurality of light emitting elements LD for emitting light of different wavelength ranges. In an embodiment, the light emitting element LD may emit the first light having a central wavelength in a wavelength range of about 440 nm to 460 nm. In an embodiment, the light emitting element LD may emit blue light.

The light source member LP may include a guide panel GP. The light source unit LU may be disposed on at least one side of the guide panel GP. The first light emitted from the light source unit LU may be incident on at least one side of the guide panel GP and provided to the display element DD. For example, the blue light emitted from the light emitting element LD is incident on the guide panel GP and transmitted to the color conversion member CCP, and light (of which wavelength has been converted in the color conversion member CCP) may be provided to the display element DD.

In the embodiment shown in FIGS. 8 and 9, one side of the guide panel GP adjacent to the light source unit LU is shown as having an inclined cross-section toward one side surface adjacent to the light source unit LU, but embodiments of the inventive concept are not limited thereto.

The guide panel GP may include a material having high light transmittance in the visible light region. For example, the guide panel GP may include glass. Alternatively, the guide panel GP may be made of a transparent polymer resin, such as polymethyl methacrylate (PMMA). In an embodiment, the guide panel GP may have a refractive index of about 1.4 to 1.55.

The light emitted from the light emitting element LD may be incident on the guide panel GP. On the lower surface of the guide panel GP, a light outgoing pattern part (e.g., a light outgoing pattern) CP may be further disposed. The light outgoing pattern part CP is provided on the lower surface of the guide panel GP, and may have a shape convexly protruding toward the housing member HAU (see FIG. 7). For example, the light outgoing pattern part CP may have a shape of a convex lens protruding toward the housing member HAU, but embodiments of the inventive concept are not limited thereto.

The light outgoing pattern part CP may be formed of a material having a different refractive index value from that of the guide panel GP. The light outgoing pattern part CP may transmit the light emitted from the light source unit LU and incident on one side of the guide panel GP to the other side of the guide panel GP, or may change the direction of light such that the light incident in the direction of the lower surface of the guide panel GP is transmitted in the direction of a light outgoing surface, which is the upper surface of the guide panel GP. The light outgoing pattern part CP changes the path of light provided to the lower surface of the guide panel GP such that the light is emitted toward the display element DD.

In the display member DP according to an embodiment of the inventive concept, the low refractive layer LRL may be disposed on the light source member LP. Referring to FIGS. 8-10, the low refractive layer LRL may be disposed on the guide panel GP.

The low refractive layer LRL includes the plurality of hollow inorganic particles HP and the matrix part MX. As for the low refractive layer LRL included in the display member DP of an embodiment, the same contents (e.g., the same descriptions) as those for the low refractive layer LRL of the embodiment described above may be applied thereto. For example, in the low refractive layer LRL, the weight ratio of the hollow inorganic particles HP to the matrix part MX may be 4:6 to 7:3. In addition, in the low refractive layer LRL, a surface of the hollow inorganic particles HP, the surface of which is adjacent the matrix part MX, may be treated with a coupling agent.

In an embodiment, the low refractive layer LRL may be directly provided on the guide panel GP. The low refractive layer LRL may be formed by being coated on the guide panel GP. In an embodiment, the plurality of the hollow inorganic particles HP are mixed with a polymer resin, which disperses the same (e.g., the plurality of the hollow inorganic particles HP are dispersed in the polymer resin), and provided (e.g., coated) on the guide panel GP, and then the polymer resin is solidified to form the low refractive layer LRL including the plurality of the hollow inorganic particles HP and the matrix part MX.

Examples of a coating method for forming the low refractive layer LRL include slit coating, spin coating, roll coating, spray coating, and inkjet printing, but a method for providing the low refractive layer LRL is not limited thereto. Alternatively, the low refractive layer LRL may be directly provided on the guide panel GP by utilizing various suitable methods such as a transfer method.

The refractive index of the low refractive layer LRL may be lower than the refractive index of the guide panel GP. The refractive index of the low refractive layer LRL may be lower than the refractive index of the color conversion member CCP provided on the low refractive layer LRL. The difference in the refractive index of the low refractive layer LRL and the refractive index of the guide panel GP may be 0.2 or greater. The low refractive layer LRL may have a refractive index lower than that of the guide panel GP such that light incident on the guide panel GP from the light source unit LU may be effectively transmitted to the other side of the guide panel GP, which is relatively spaced apart from the light source unit LU.

Although not shown in the drawings, on the low refractive layer LRL, a capping layer may be further disposed. The capping layer may be a protection layer for protecting the low refractive layer LRL. The capping layer may be an inorganic material layer including at least one inorganic material selected from silicon nitride, silicon oxide, and silicon oxynitride. The capping layer may be directly disposed on the low refractive layer LRL. The capping layer may be formed of a single layer or a plurality of layers.

On the low refractive layer LRL, the color conversion member CCP may be disposed. The color conversion member CCP is disposed between the light source member LP and the display element DD, and may include converters QD1 and QD2 for wavelength-converting (e.g., for converting the wavelength of) the first light provided from the light source unit LU. The color conversion member CCP may include the first converter QD1 for wavelength-converting the first light (e.g., having a first wavelength) into a second light (e.g., having a second wavelength) and the second converter QD2 for wavelength-converting the first light into a third light (e.g., having a third wavelength).

The color conversion member CCP may include a color conversion layer CCL including the first converter QD1 and the second converter QD2 and a barrier layer BL disposed on at least one of the upper surface and the lower surface of the color conversion layer CCL. That is, the barrier layer BL may be disposed on at least one of the upper surface and the lower surface of the color conversion member CCP.

The barrier layer BL may serve to reduce or prevent penetration of moisture and/or oxygen (hereinafter, referred to as 'moisture/oxygen'). The barrier layer BL may be disposed on the color conversion layer CCL to prevent or substantially prevent the color conversion layer CCL from being exposed to moisture/oxygen. In addition, the barrier layer BL may cover the color conversion layer CCL.

The barrier layer BL may include at least one inorganic layer. That is, the barrier layer BL may include an inorganic material. For example, the barrier layer BL may include silicon nitride, aluminum nitride, zirconium nitride, titanium nitride, hafnium nitride, tantalum nitride, silicon oxide, aluminum oxide, titanium oxide, tin oxide, cerium oxide and/or silicon oxynitride, a metal thin film having light transmittance, and/or the like. In addition, the barrier layer BL may further include an organic film. The barrier layer BL may be formed of a single layer or a plurality of layers.

The color conversion layer CCL may be directly disposed on the low refractive layer LRL. In this case, on the lower surface on the color conversion layer CCL, the barrier layer BL may be omitted. The low refractive layer LRL may serve as the barrier layer BL on the lower surface of the color conversion layer CCL. Referring to FIG. 9, the barrier layer BL may cover the color conversion layer CCL on (e.g., the upper surface of) the color conversion layer CCL.

In an embodiment, the color conversion member CCP may include the first converter QD1 for wavelength-converting the first light provided from the light source unit LU into green light and the second converter QD2 for wavelength-converting the first light into red light. Also, in an embodiment, the first light may be blue light, but is not limited thereto. In addition, the second converter QD2 may be excited by the second light.

The first converter QD1 may be (or include) a green quantum dot excited by the blue light, which is the first light, to emit green light, which is the second light. The second converter QD2 may be (or include) a red quantum dot excited by at least one of the blue light, which is the first light, and the green light, which is the second light, to emit red light.

A quantum dot may be a particle for wavelength-converting the light provided from the light source unit LU. A quantum dot is a material having a crystal structure of a few nanometers in size, and is composed of hundreds to thousands of atoms. Due to a small size thereof, a quantum dot exhibits a quantum confinement effect in which an energy band gap is increased. When light having a higher energy than the bandgap is incident on a quantum dot, the quantum dot is excited by absorbing the light, and then falls to a ground state by emitting light of a specific wavelength.

The wavelength of the emitted light has a value corresponding to the band gap. When the size and composition of a quantum dot is adjusted, light emitting properties caused by the quantum confinement effect may be adjusted. Depending on the particle size of a quantum dot, the color of emitted light may be changed. When the particle size of a quantum dot is smaller, light of the shorter wavelength region may be emitted. For example, the particle size of a quantum dot for emitting green light may be smaller than the particle size of a quantum dot for emitting red light.

A quantum dot may be selected from Group II-VI compounds, Group III-V compounds, Group IV-VI compounds, Group IV elements, Group IV compounds, and combinations thereof.

The Group II-VI compounds may be selected from a binary compound selected from CdSe, CdTe, ZnS, ZnSe, ZnTe, ZnO, HgS, HgSe, HgTe, MgSe, MgS, and mixtures thereof, a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof, and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The Group III-V compounds may be selected from a binary compound selected from GaN, GaP, GaAs, GaSb, AlN, AlP, AlAs, AlSb, InN, InP, InAs, InSb, and mixtures thereof, a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and mixtures thereof, and a quaternary compound selected from GaAlNAs, GaAlNSb, GaAlPAs, GaAlPSb, GaInNP, GaIn-NAs, GaInNSb GaInPAs, GaInPSb, InAlNP, InAlNAs, InAlNSb, InAlPAs, InAlPSb, and mixtures thereof. The Group IV-VI compounds may be selected from a binary compound selected from SnS, SnSe, SnTe, PbS, PbSe, PbTe, and mixtures thereof, a ternary compound selected from SnSeS, SnSeTe, SnSTe, PbSeS, PbSeTe, PbSTe, SnPbS, SnPbSe, SnPbTe, and mixtures thereof, and a quaternary compound selected from SnPbSSe, SnPbSeTe, SnPbSTe, and mixtures thereof. The Group IV elements may be selected from Si, Ge, and mixtures thereof. The Group IV compounds may be a binary compound selected from SiC, SiGe, and mixtures thereof.

Also, a binary compound, a ternary compound, or a quaternary compound may be present in a particle in a uniform concentration, or may be present in the same particle in a concentration partially different from each other's. In other words, a binary compound, a ternary compound, or a quaternary compound may be present in a particle in a nonuniform concentration.

A quantum dot may have a core-shell structure in which a core and a shell surrounding the core are included. In addition, one quantum dot having a core-shell structure may surround another quantum dot. The interface of the core and the shell may have a concentration gradient in which the concentration of an element present in the shell becomes lower toward the center.

A quantum dot may be a particle having a nanometer scale size. The quantum dot may have a full width of half maximum (FWHM) of a light emission wavelength spectrum of about 45 nm or less, for example, about 40 nm or less, or about 30 nm or less, and the color purity and/or color reproducibility may be improved in the above ranges. In addition, light emitted through the quantum dot is emitted in all directions so that a wide viewing angle may be realized (e.g., the viewing angle may be improved or widened).

In addition, although the form of the quantum dot is not particularly limited as long as it is a form commonly utilized in the art, the quantum dot in the form of spherical, pyramidal, multi-arm, cubic nanoparticles, nanotubes, nanowires, nanofibers, nanoparticles, and/or the like may be utilized.

In the display member DP of an embodiment described with reference to FIGS. 8-10, the display element DD may be provided with white light. In the display member DP of an embodiment, light emitted from the light source unit LU, transmitted through the color conversion member CCP, and then provided to the display element DD may be white light. That is, the display element DD may be provided with mixed light of the blue light provided from the light source unit LU, the green light emitted from the first converter QD1, and the red light emitted from the second converter QD2.

The color conversion member CCP may include the first converter QD1, the second converter QD2, and a base resin BR. The base resin BR is a medium in which the first and second converters QD1 and QD2 are dispersed, and may be made of various suitable resin compositions which may be generally referred to as a binder. However, embodiments of the inventive concept are not limited thereto. In the present specification, any suitable medium capable of dispersing and disposing the first and second converters QD1 and QD2 may be referred to as the base resin BR regardless of the name, additional other functions, constituent materials, and/or the like thereof. The base resin BR may be a polymer resin. For example, the base resin BR may be an acrylic-based resin, a urethane-based resin, a silicone-based resin, an epoxy-based resin, and/or the like. The base resin BR may be a transparent resin.

The display member DP of an embodiment may have improved durability by including the low refractive layer LRL with improved strength of the embodiment described above between the guide panel DP and the color conversion member CCP. That is, the electronic device DS (see FIG. 7) including the display member DP of an embodiment has good optical properties and may exhibit improved durability and reliability.

Figure 11:
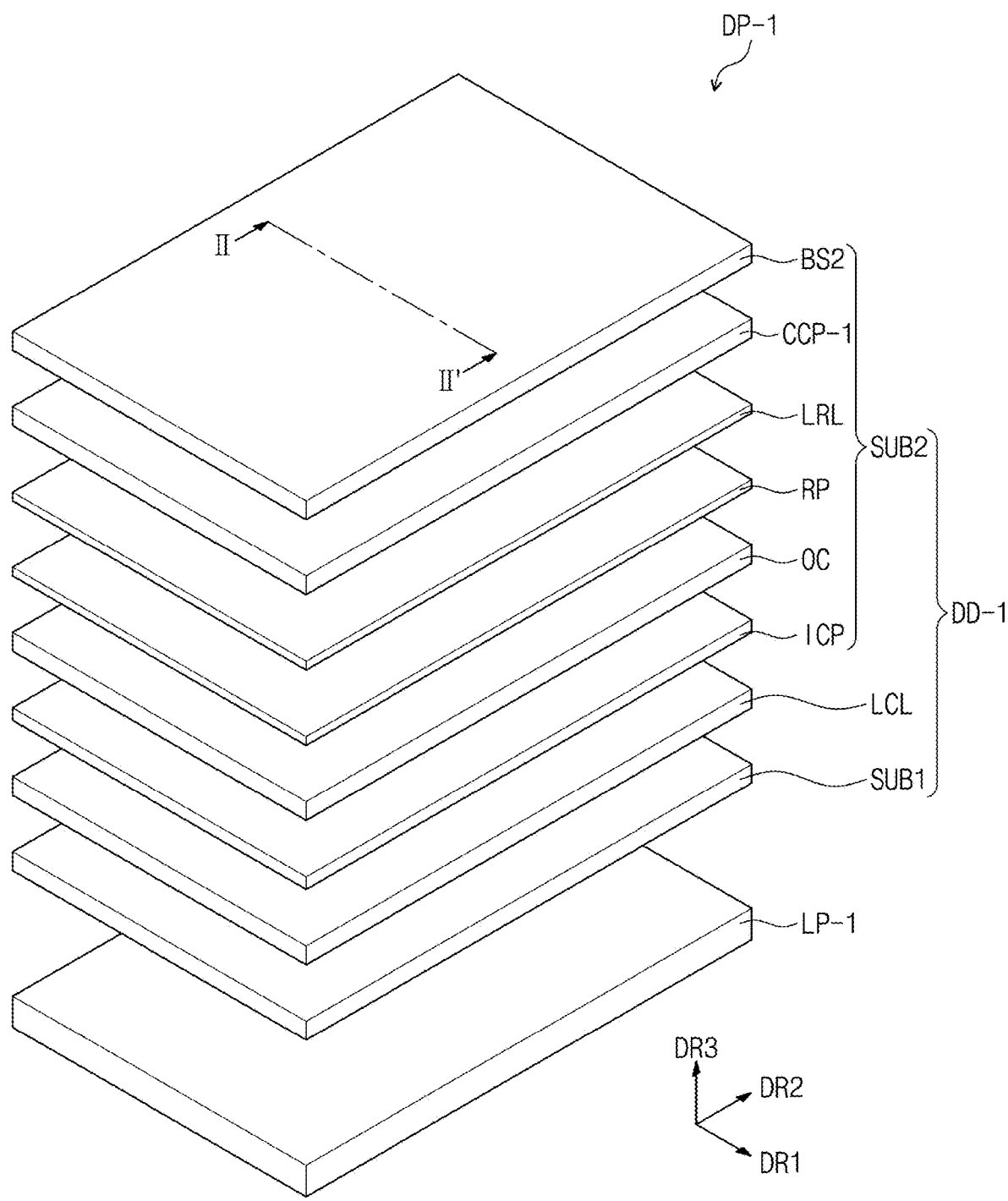
FIG. 11 is an exploded perspective view of a display member according to an embodiment of the inventive concept.
Figure 12:
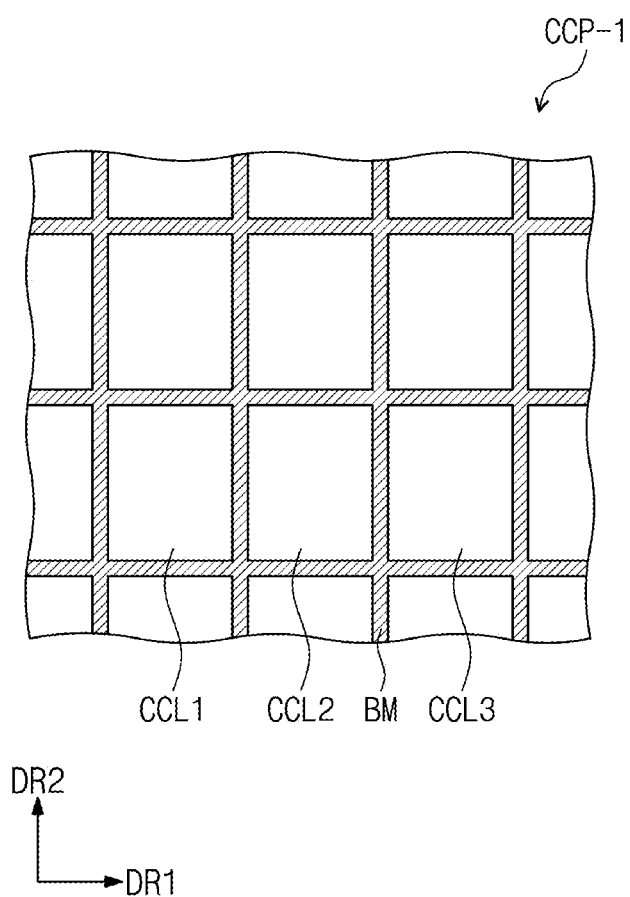
FIG. 12 is a top view of a color conversion member according to an embodiment of the inventive concept.
Figure 13:
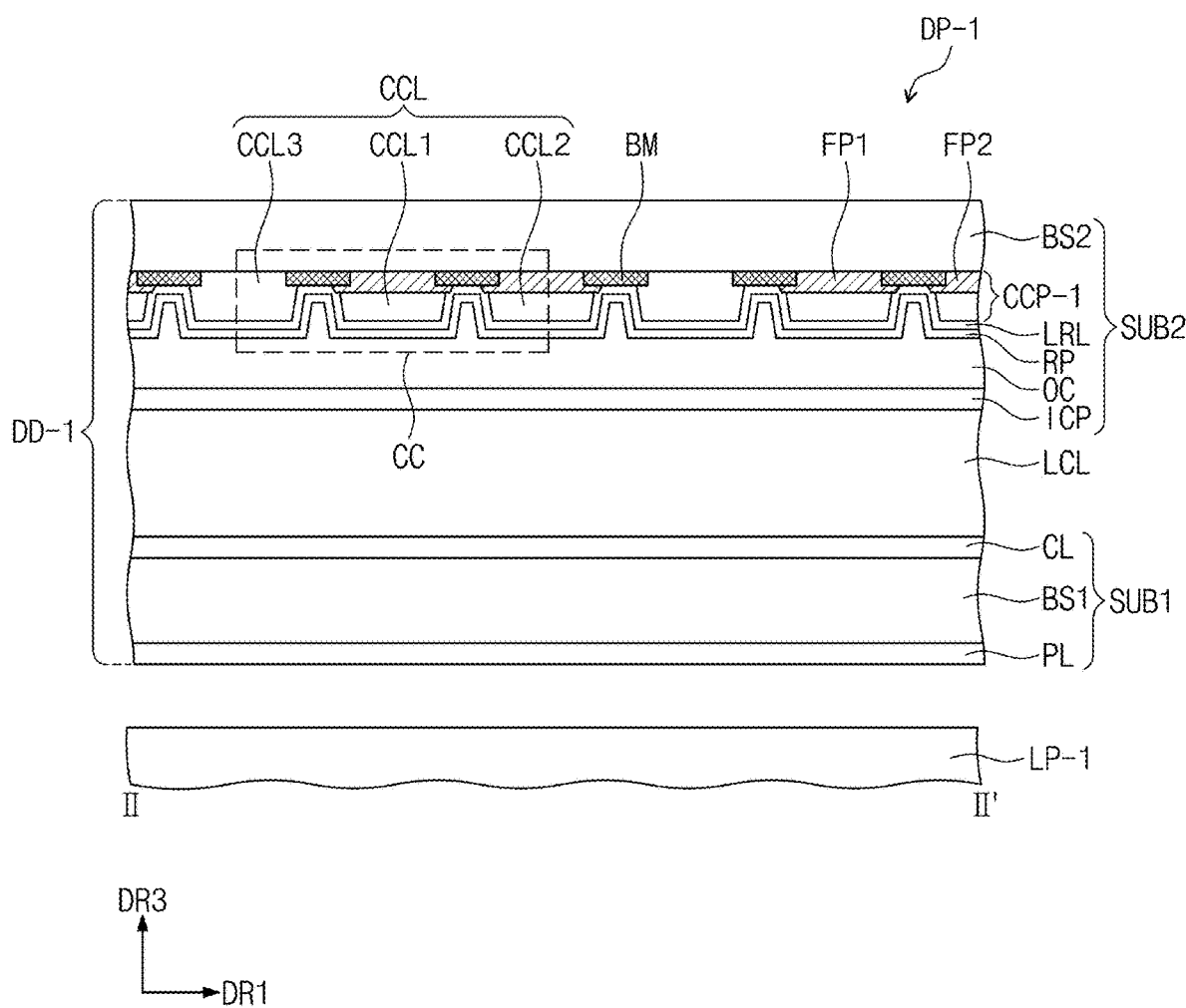
FIG. 13 is a cross-sectional view taken along the line II-II' shown in FIG. 11.
Figure 14:
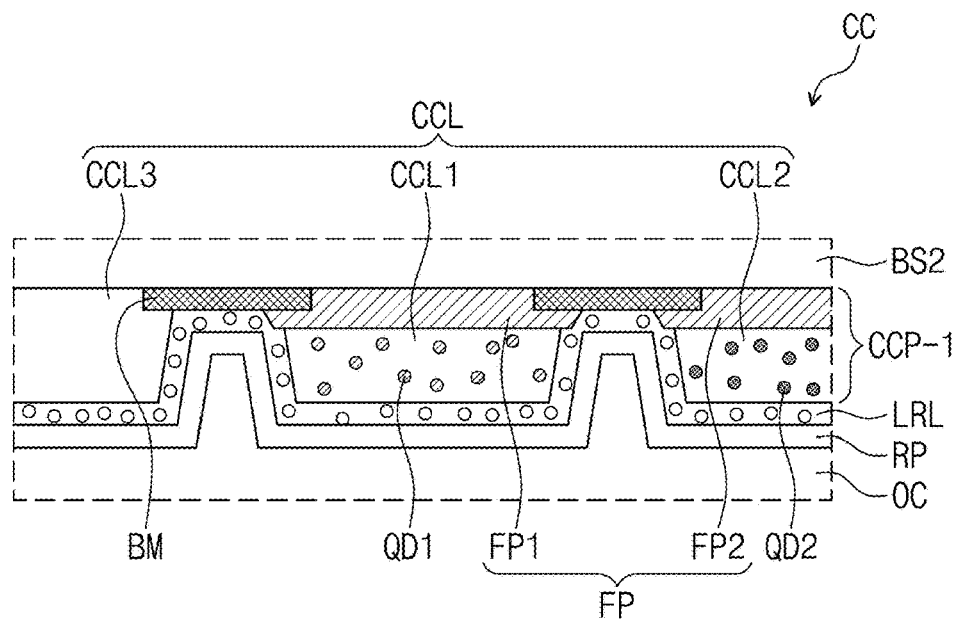
FIG. 14 is a cross-sectional view showing the CC region of FIG. 13.
Figure 15:
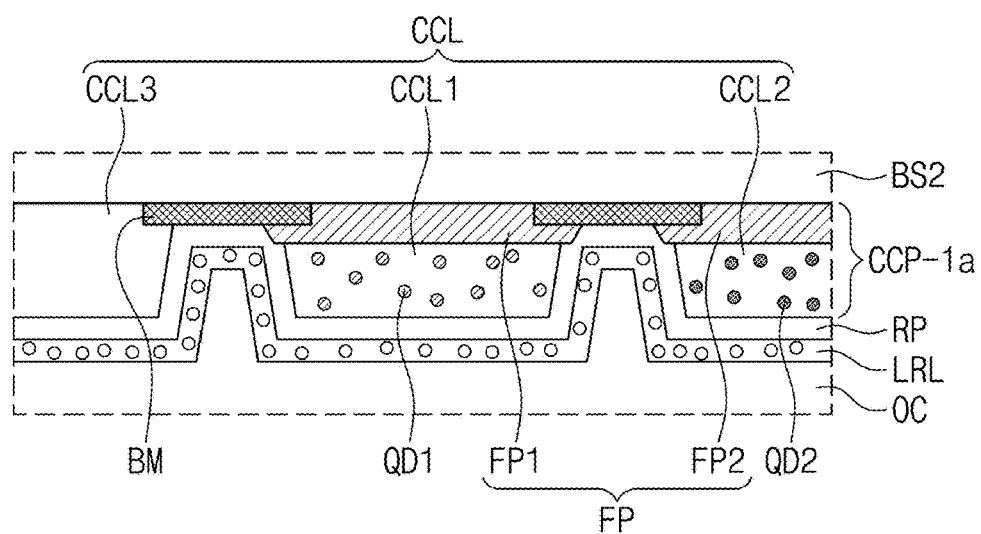
FIG. 15 is a cross-sectional view showing another example embodiment corresponding to the CC region of FIG. 14.

FIG. 11 shows another embodiment of a display member included in the electronic device DS (see FIG. 7) of an embodiment. FIG. 12 is a top view showing a portion of a color conversion member included in the display member of FIG. 11. FIG. 13 is a cross-sectional view taken along the line II-II' shown in FIG. 11. FIG. 14 is a cross-sectional view showing the CC region of FIG. 13. FIG. 15 is a cross-sectional view showing another example of a portion included in the display member of FIG. 11. FIG. 15 may be a cross-sectional view of another embodiment corresponding to the CC region of FIG. 14.

A display member DP-1 of an embodiment may include a first base substrate BS1 and a second base substrate BS2 facing each other, and a liquid crystal layer LCL disposed between the first base substrate BS1 and the second base substrate BS2. That is, the display member DP-1 of an embodiment includes a display element DD-1 disposed on a light source member LP-1, and the display element DD-1 may be a liquid crystal display element including the liquid crystal layer LCL between the first and second base substrates BS1 and BS2 facing each other.

Referring to FIGS. 11-15, the display element DD-1 may include a color conversion member (e.g., a color converter) CCP1. The color conversion member CCP-1 may be disposed on the liquid crystal layer LCL. The display element DD-1 may include a first substrate SUB1 relatively adjacent to the light source member LP-1 and a second substrate SUB2 facing the first substrate SUB1 (with the liquid crystal layer LCL interposed therebetween) and including the color conversion member CCP-1.

The light source member LP-1 may be a backlight unit which provides light to the display element DD-1. For example, in an embodiment, the light source member LP-1 may be a direct (e.g., direct type) backlight unit or an edge (e.g., edge type) backlight unit, and/or the like, but embodiments of the inventive concept are not limited thereto. Any suitable light source member which provides light to the display element DD-1 may be utilized without limitation.

In the display member DP-1 of an embodiment, the light source member LP-1 may provide a first light to the display element DD-1. For example, the light source member LP-1 may provide blue light to the display element DD-1.

The first substrate SUB1 may include the first base substrate BS1 and a circuit layer CL provided on the first base substrate BS1.

The first base substrate BS1 may be a member which provides a base surface on which the circuit layer CL is disposed. The first base substrate BS1 may be a glass substrate, a metal substrate, a plastic substrate, and/or the like. However, embodiments of the inventive concept are not limited thereto, and the first base substrate BS1 may be an inorganic layer, an organic layer, or a composite material layer.

In an embodiment, the circuit layer CL is disposed on the first base substrate BS1, and the circuit layer CL may include a plurality of transistors. The transistors may each include a control electrode, an input electrode, and an output electrode. For example, the circuit layer CL may include a switching transistor, a driving transistor and/or the like to drive the display element DD-1.

The display element DD-1 may further include a first polarizing layer PL and a second polarizing layer ICP. The first polarizing layer PL may be included in the first substrate SUB1. Referring to FIG. 11 and FIG. 13, in an embodiment, the first polarizing layer PL may be disposed on the lower surface of the first base substrate BS1. However, embodiments of the inventive concept are not limited thereto. The first polarizing layer PL may be disposed on an upper portion (e.g., on top) of the first base substrate BS1, and may be disposed between the liquid crystal layer LCL and the first base substrate BS1.

The first polarizing layer PL may be provided as a separate member, or may include a polarizer formed by coating or deposition. The first polarizing layer PL may be formed by coating a material including a dichroic dye and a liquid crystal compound. Alternatively, the first polarizing layer PL may include a wire grid polarizer.

The second substrate SUB2 facing the first substrate SUB1 may include the second base substrate BS2, the color conversion member CCP-1, and the low refractive layer LRL. In addition, the second substrate SUB2 may further include a reflection layer RP, a planarization layer OC, and the second polarizing layer ICP.

The second base substrate BS2 may be a member which provides a base surface on which the color conversion member CCP-1 is disposed. The second base substrate BS2 may be a glass substrate, a metal substrate, a plastic substrate, and/or the like. However, embodiments of the inventive concept are not limited thereto, and the second base substrate BS2 may be an inorganic layer, an organic layer, or a composite material layer.

In the display member DP-1 of an embodiment, the color conversion member CCP-1 may include a plurality of color conversion parts (e.g., a plurality of color converters) CCL1, CCL2, and CCL3 spaced apart from each other on a plane. In addition, the color conversion member CCP-1 may further include a light blocking unit BM disposed between the first to third color conversion parts CCL1, CCL2, and CCL3. Referring to FIG. 12, the plurality of color conversion parts CCL1, CCL2, and CCL3 may be disposed to be spaced apart from each other on the plane defined by the first direction axis DR1 and the second direction axis DR2.

Referring to FIG. 12, in the first direction axis DR1 direction, the first to third color conversion parts CCL1, CCL2, and CCL3, which emit light of different colors, may be disposed side by side while being spaced apart from each other, and in the second direction axis DR2 direction, color conversion parts which emit light of the same color may be disposed side by side while being spaced apart from each other. Between the color conversion parts CCL1, CCL2, and CCL3 disposed spaced apart from each other, the light blocking unit BM is disposed, and the light blocking unit BM may be a black matrix. The light blocking unit BM may include an organic light blocking material or an inorganic shielding material, each including a black pigment and/or a black dye. The light blocking unit BM may reduce or prevent a light leakage phenomenon and may distinguish the boundaries between the adjacent color conversion parts CCL1, CCL2, and CCL3.

In addition, at least a portion of the light blocking unit BM may be disposed to overlap the neighboring color conversion parts CCL1, CCL2, and CCL3. That is, on a plane defined by the first direction axis DR1 and the third direction axis DR3, the light blocking unit BM may be disposed such that a portion thereof overlaps the neighboring color conversion parts CCL1, CCL2, and CCL3 in the thickness direction.

In an embodiment, the color conversion member CCP-1 may include the first converter QD1 for absorbing the first light and wavelength-converting the first light into the second light and the second converter QD2 for absorbing the first light and wavelength-converting the first light into the third light. For example, the first light may be blue light, the second light may be green light, and the third light may be red light.

Here, as for the first converter QD1 and the second converter QD2 included in the color conversion member CCP-1 according to an embodiment of the inventive concept, the same description of the converters QD1 and QD2 included in the color conversion member CCP of the embodiment described with reference to FIGS. 8-10 may be applied thereto. For example, the first converter QD1 may be (or include) a green quantum dot, and the second converter QD2 may be (or include) a red quantum dot.

The color conversion member CCP-1 may include a first conversion part (e.g., a first converter) CCL1 including the first converter QD1, a second color conversion part (e.g., a second converter) CCL2 including the second converter QD2, and a third color conversion part (e.g., a third converter) CCL3 for transmitting the first light. For example, the first converter QD1 may absorb the first light, which is blue light, and emit green light, and the second converter QD2 may absorb the first light, which is blue light, and emit red light. That is, the first conversion part CCL1 may be the first light emitting region which emits green light, and the second color conversion part CCL2 may be the second light emitting region which emits red light.

In addition, the third color conversion part CCL3 may not include a color converter. The third color conversion part CCL3 may transmit the first light (e.g., first color light) provided from the light source member LP-1. That is, the third color conversion part CCL3 may transmit blue light. The third color conversion part CCL3 may be formed of a polymer resin. For example, the third color conversion part CCL3 may be an acrylic-based resin, a urethane-based resin, a silicone-based resin, an epoxy-based resin, and/or the like. The third color conversion part CCL3 may be formed of a transparent resin, or an opaque (e.g., a white) resin.

The first to third color conversion parts CCL1, CCL2, and CCL3 may be provided on the second base substrate BS2. The first to third color conversion parts CCL1, CCL2, and CCL3 may be patterned and provided on one surface of the second base substrate BS2. The first to third color conversion parts CCL1, CCL2, and CCL3 may be provided on the lower surface of the second base substrate BS2.

In the display member DP-1 according to an embodiment of the inventive concept, the low refractive layer LRL may be provided between the light source member LP-1 and the color conversion member CCP1. As for the low refractive layer LRL, the same contents (e.g., the same descriptions) as those for the low refractive layer LRL of the embodiment described with reference to FIGS. 1-6 may be applied thereto. For example, the low refractive layer LRL may include the plurality of hollow inorganic particles HP (see FIG. 1) and the matrix part MX (see FIG. 1) in a weight ratio of 4:6-7:3. In addition, an outer surface of the hollow inorganic particles HP may be treated with a coupling agent.

In the display member DP-1 of an embodiment, the low refractive layer LRL may be disposed on a lower portion (e.g., on the bottom) of the color conversion member CCP-1 to change the direction of light which is emitted from the color conversion member CCP-1 and direct it toward an upper portion of the display member DP-1. For example, the low refractive layer LRL may be disposed on a lower portion of the color conversion member CCP-1 to serve an optical extraction function for reflecting the light emitted from the color conversion member CCP-1 back to proceed in an upper direction of the display member DP-1. Accordingly, the display member DP-1 of an embodiment may exhibit improved durability and increased optical efficiency.

However, embodiments of the inventive concept are not limited thereto. Unlike the one shown in the drawings, the low refractive layer LRL may be disposed on an upper portion (e.g., on top) of the color conversion member CCP-1.

In the display member DP-1 according to an embodiment of the inventive concept, the second substrate SUB2 may further include the reflection layer RP. The reflection layer RP may be disposed between the color conversion member CCP-1 and the liquid crystal layer LCL. The reflection layer RP may transmit the first light, and may reflect the second and third light. The reflection layer RP may be a selective transmissive reflective layer.

The reflection layer RP may transmit the first light provided from the light source member LP-1, and may reflect the second and third light emitted from the color conversion parts CCL1, CCL2, and CCL3 of the color conversion member CCP-1 and direct them toward a lower portion of the display member DP-1 so as to be emitted in an upper direction of the display member DP-1. The reflection layer RP may be a single layer, or a laminate of a plurality of insulating films.

Although not shown in the drawings, for example, the reflection layer RP may include a plurality of insulating films (e.g., laminated over one another), so that the range of transmission and reflection wavelengths may be determined depending on the refractive index difference between the laminated layers, the thickness of each of the laminated layers, and the number of laminated layers, and/or the like.

In an embodiment, the reflection layer RP may include a first insulating film and a second insulating film which have different refractive indexes. The reflection layer RP may include at least one first insulating film and at least one second insulating film. Each of the first insulating film and the second insulating film may be provided in a plurality and alternately laminated.

For example, as an insulating film having a relatively high refractive index, a metal oxide material may be utilized. Specifically, an insulating film of a high refractive index may include at least one of TiOx, TaOx, HfOx, or ZrOx. In addition, an insulating film having a relatively low refractive index may include SiOx and/or SiCOx. In addition, in an embodiment, the reflection layer RP may be formed by alternately and repetitively depositing SiNx and SiOx.

Referring to FIG. 14, the reflection layer RP may be disposed on a lower portion (e.g., on the bottom) of the low refractive layer LRL. For example, the low refractive layer LRL may be disposed between the reflection layer RP and the color conversion parts CCL1, CCL2, and CCL3, and cover the color conversion parts CCL1, CCL2, and CCL3.

However, embodiments of the inventive concept are not limited thereto. As shown in FIG. 15, the reflection layer RP may be disposed on an upper portion (e.g., on top) of the low refractive layer LRL. Referring to FIG. 15, a color conversion member CCP-1a, the reflection layer RP, and the low refractive layer LRL may be sequentially disposed on the second base substrate BS2. That is, the reflection layer RP is disposed between the low refractive layer LRL and the color conversion parts CCL1, CCL2, and CCL3, and the reflection layer RP may cover the color conversion parts CCL1, CCL2, and CCL3.

In addition, in an embodiment, the color conversion members CCP-1 and CCP-1a may further include optical filter layers FP1 and FP2 disposed on the color conversion layer CCL including the first to third color conversion parts CCL1, CCL2, and CCL3.

The optical filter layers FP1 and FP2 may be disposed on the color conversion layer CCL including the first to third color conversion parts CCL1, CCL2, and CCL3, and may block the first light and transmit the second and/or third light. That is, the optical filter layers FP1 and FP2 may block blue light, and may transmit green light and red light. The optical filter layers FP1 and FP2 may be disposed on the first and second color conversion parts CCL1 and CCL2, and may not be disposed on the third color conversion part CCL3.

The optical filter layers FP1 and FP2 may be composed of a single layer, or may be a laminate of a plurality of layers. For example, the optical filter layers FP1 and FP2 may be a single layer including a material for absorbing blue light, or may have a structure in which an insulating layer of a low refractive index (such as the reflection layer RP) and an insulating layer of a high refractive index are laminated.

In addition, the optical filter layers FP1 and FP2 may include a pigment and/or a dye to block light of a specific wavelength. For example, in an embodiment, the optical filter layers FP1 and FP2 may be a yellow color filter layer which absorbs blue light in order to block the blue light.

The optical filter layers FP1 and FP2 may include a first optical filter layer FP1 disposed on the first color conversion part CCL1, and a second optical filter layer FP2 disposed on the second color conversion part CCL2. The first optical filter layer FP1 may be a filter layer which blocks blue light and transmits green light. In addition, the second optical filter layer FP2 may be a filter layer which blocks blue light and transmits red light.

The second substrate may further include the planarization layer OC. In the second substrate SUB2, the reflection layer RP and/or the low refractive layer LRL may be disposed to surround concave and convex parts of the color conversion parts CCL1, CCL2, and CCL3. That is, in a process of producing the display member DP-1 according to an embodiment, the reflection layer RP and/or the low refractive layer LRL may be provided on the color conversion parts CCL1, CCL2, and CCL3 after the color conversion parts CCL1, CCL2, and CCL3 are disposed. Accordingly, the refection layer RP and/or the low refractive layer LRL are disposed along the concave and convex parts of the color conversion parts CCL1, CCL2, and CCL3 to have concave and convex parts corresponding to concave and convex parts of the color conversion layer CCL (including the color conversion parts CCL1, CCL2, and CCL3). On a lower portion (e.g., on the bottom) of the reflection layer RP and/or the low refractive layer LRL, the planarization layer OC may be disposed.

The planarization layer OC may be disposed to surround concave and convex parts of the reflection layer RP and the low refractive layer LRL. The planarization layer OC may be disposed to fill the concave and convex parts on the lower surface of the reflection layer RP or the low refractive layer LRL to planarize a surface adjacent to the second polarizing layer ICP, which is adjacent to the liquid crystal layer LCL.

The second polarizing layer ICP may be included in the second substrate SUB2. The second polarizing layer ICP may be disposed between the liquid crystal layer LCL and the color conversion member CCP1. The second polarizing layer ICP may be a polarizing layer in the form of an in-cell. The second polarizing layer ICP may be formed by coating a material including a dichroic dye and a liquid crystal compound. Alternatively, the second polarizing layer ICP may be a wire grid polarizing layer.

In addition, in the electronic device DS and the display member DP-1 of the embodiment described with reference to FIGS. 11-15, the low refractive layer LRL was described to be disposed on a lower portion (e.g., on the bottom) of the color conversion members CCP-1 and CCP-1a, but embodiments of the inventive concept are not limited thereto. For example, the low refractive layer LRL may be disposed on an upper portion (e.g., on top) of the color conversion members CCP-1 and CCP-1a. The low refractive layer LRL may be disposed on the upper portion of the color conversion parts CCL1, CCL2, and CCL3 to increase optical efficiency of light emitted to the outside.

In the electronic device DS and the display member DP-1 of the embodiment described with reference to FIGS. 11-15, the low refractive layer LRL of the embodiment described above with improved strength is utilized, so that improved durability may be achieved. Also, the low refractive layer LRL is included on the upper portion of the color conversion members CCP-1 and CCP-1a to increase optical efficiency in the display member DP-1. That is, the electronic device DS (see FIG. 7) including the display member DP-1 of an embodiment has improved durability and reliability and may exhibit high optical efficiency.

Figure 16:
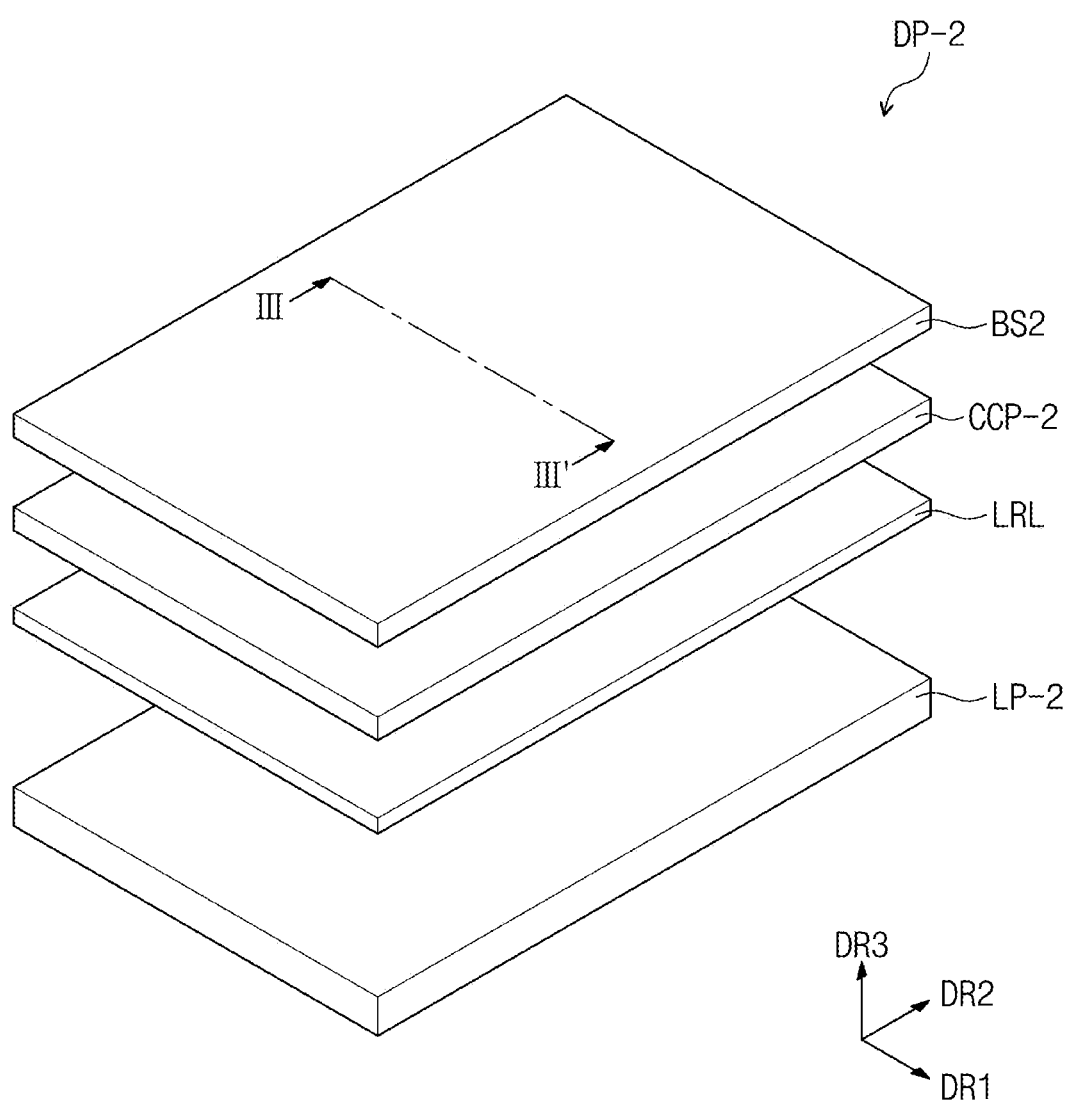
FIG. 16 is an exploded perspective view of a display member according to an embodiment of the inventive concept.
Figure 17:
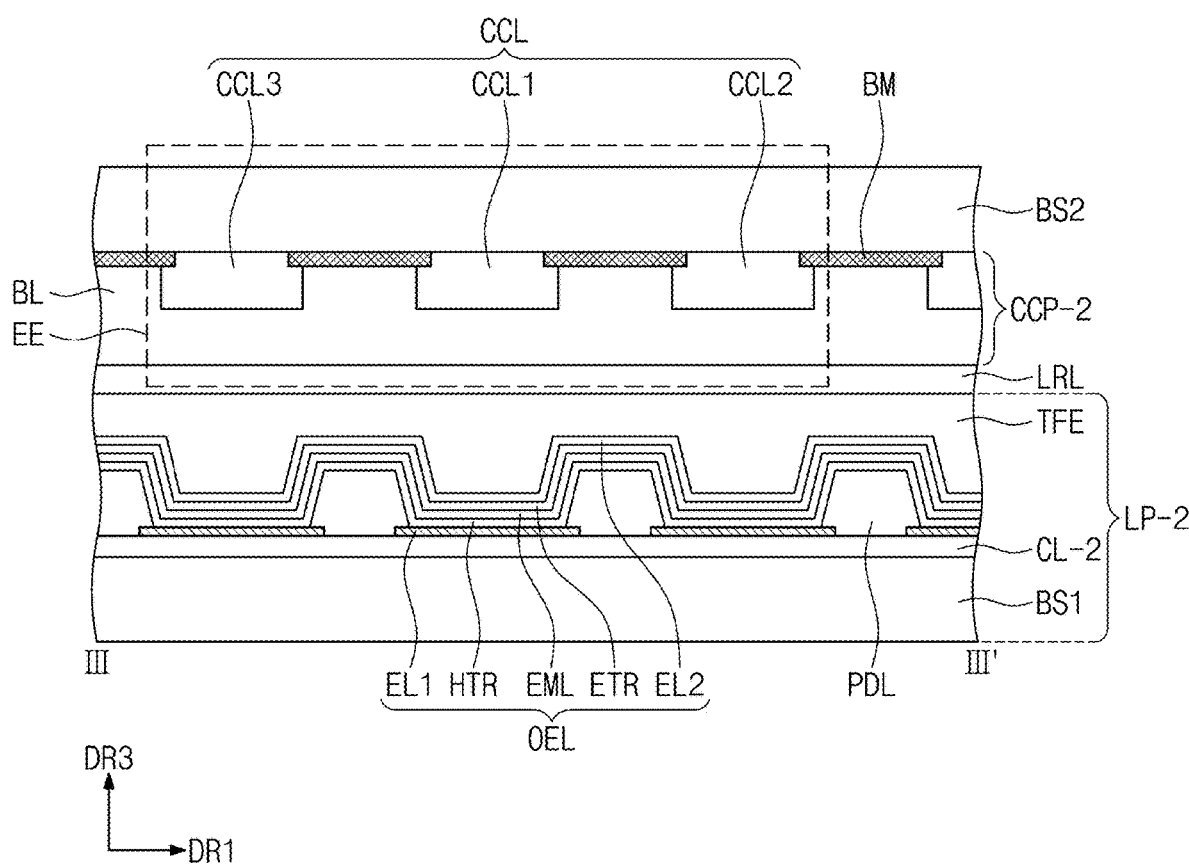
FIG. 17 is a cross-sectional view taken along the line III-III' shown in FIG. 16.
Figure 18:
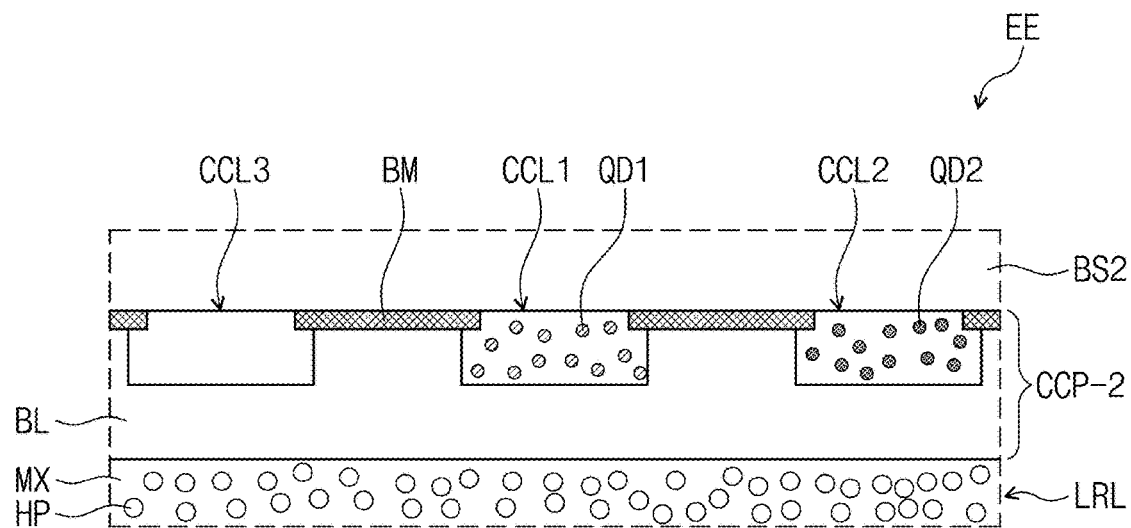
FIG. 18 is a cross-sectional view showing the EE region of FIG. 17.
Figure 19:
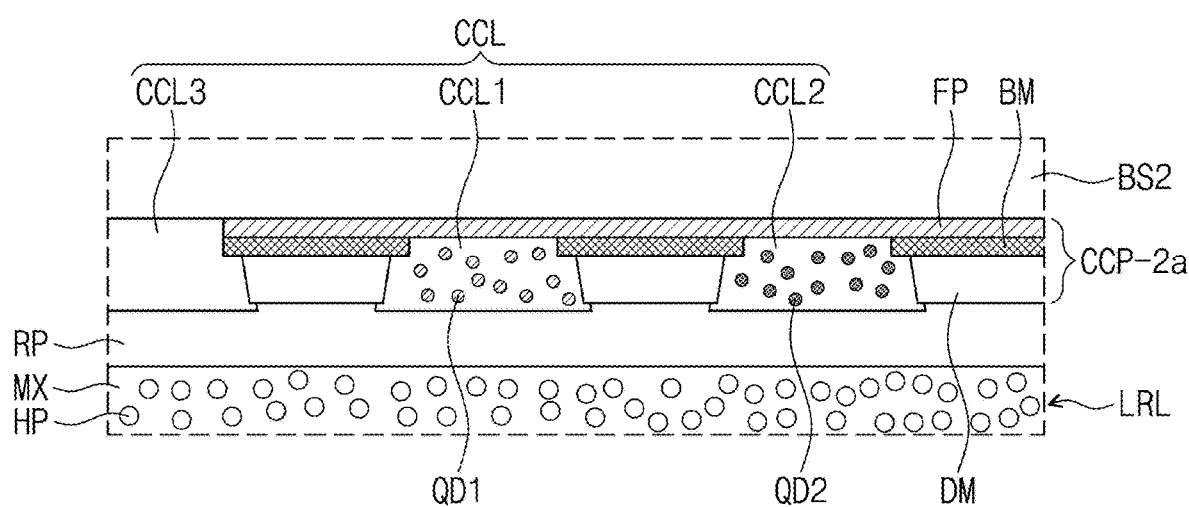
FIG. 19 is a cross-sectional view showing another example embodiment corresponding to the EE region of FIG. 18.
Figure 20:
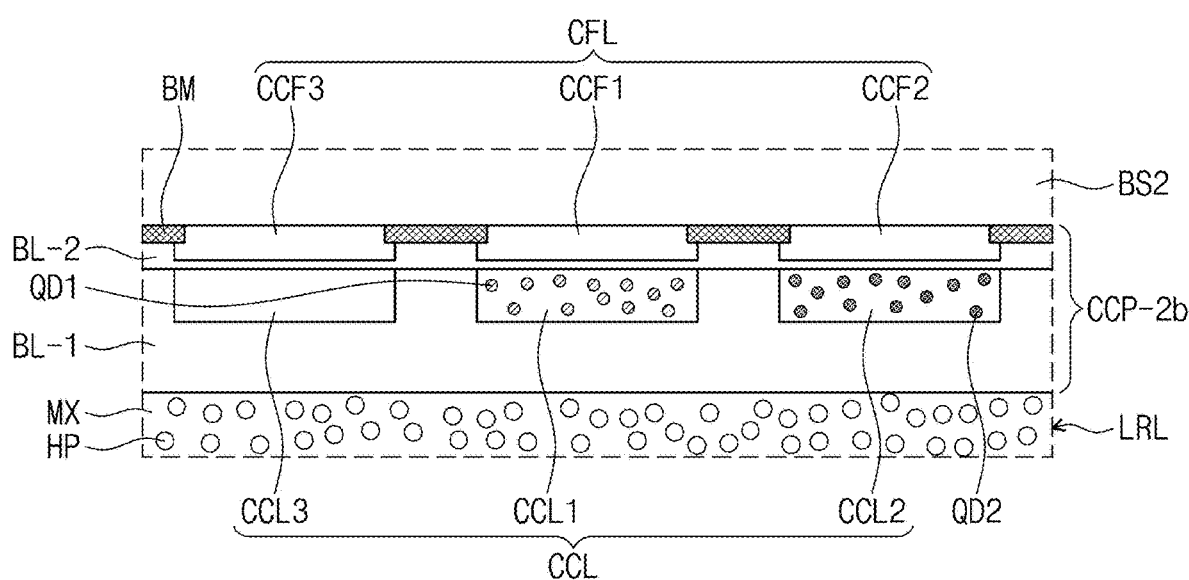
FIG. 20 is a cross-sectional view showing another example embodiment corresponding to the EE region of FIG. 18.

FIG. 16 shows another embodiment of a display member included in the electronic device DS (see FIG. 7) of an embodiment. FIG. 17 is a cross-sectional view taken along the line III-III' shown in FIG. 16. FIG. 18 is a cross-sectional view showing the EE region of FIG. 17. FIG. 19 and FIG. 20 are cross-sectional views showing another example of a portion included in the display member of FIG. 16.

A display member DP-2 of an embodiment may include a light source member (e.g., a light source) LP-2, the low refractive layer LRL provided on the light source member LP-2, and a color conversion member (e.g., a color converter) CCP-2 provided on the low refractive layer LRL. The display member DP-2 of an embodiment may include an organic electroluminescence element.

In the display member DP-2 of an embodiment, the light source member LP-2 may include an organic electroluminescence element OEL. Also, the display member DP-2 may include the first base substrate BS1, a circuit layer CL-2, and a sealing member TFE.

The first base substrate BS1 may be a member for providing a base surface on which the organic electroluminescence element OEL is disposed. The first base substrate BS1 may be a glass substrate, a metal substrate, a plastic substrate, and/or the like. However, embodiments of the inventive concept are not limited thereto, and the first base substrate BS1 may be an inorganic layer, an organic layer, or a composite material layer.

The circuit layer CL-2 is disposed on the first base substrate BS1, and the circuit layer CL-2 may include a plurality of transistors. The transistors may each include a control electrode, an input electrode, and an output electrode. For example, the circuit layer CL-2 may include a switching transistor, a driving transistor and the like to drive the organic electroluminescence element OEL.

On the circuit layer CL-2, the organic electroluminescence element OEL may be provided. The organic electroluminescence element OEL may include a first electrode EL1 and a second electrode EL2 facing each other, and a plurality of organic layers disposed between the first electrode EL1 and the second electrode EL2. The organic electroluminescence element OEL may include a hole transport region HTR, a light emitting layer EML, and an electron transport region ETR disposed between the first electrode EL1 and the second electrode EL2.

The organic electroluminescence element OEL may emit the first light. For example, the organic electroluminescence element OEL may emit blue light.

Referring to FIG. 17, in the display member DP-2 of an embodiment, the light emitting layer EML of the organic electroluminescence element OEL may be provided as a common layer on the first base substrate BS1. However, embodiments of the inventive concept are not limited thereto. The light emitting layer EML may be patterned and provided (e.g., in the form of a plurality of separated regions). For example, the light emitting layer EML may be patterned by being separated (e.g., divided) by a pixel defining layer PDL. The light emitting layer EML may be patterned to correspond to each of the first to third color conversion parts CCL1, CCL2, and CCL3.

In the organic electroluminescence element OEL, the sealing member TFE may be included, and the sealing member TFE may be disposed on the second electrode EL2. The sealing member TFE may be directly disposed on the second electrode EL2. The sealing member TFT may be a single layer, or a laminate of a plurality of layers. The sealing member TFE may be a thin film sealing layer. The sealing member TFE protects the organic electroluminescence device OEL. The sealing member TFE may cover the organic electroluminescence device OEL. The organic electroluminescence device OEL may be sealed by the sealing member TFE.

The sealing member TFE may include at least one organic film and at least one inorganic film. In the sealing member TFE, the least one organic film and the at least one inorganic film may be alternately disposed. For example, the sealing member TFE may include two inorganic films and an (e.g., one) organic film disposed between the two inorganic films. In the sealing member TFE, the inorganic film may include an inorganic material such as aluminum oxide and/or silicon nitride, and the organic film may include an acrylate-based organic material.

The color conversion member CCP-2 may be disposed on the light source member LP-2 including the organic electroluminescence device OEL. The low refractive layer LRL may be provided between the light source member LP-2 and the color conversion member CCP-2. As for the low refractive layer LRL, the same contents (e.g., the same descriptions) as those for the low refractive layer LRL of the embodiment described with reference to FIGS. 1-6 may be applied thereto. For example, the low refractive layer LRL may include the plurality of hollow inorganic particles HP and the matrix part MX in a weight ratio of 4:6-7:3. In addition, the outer surface of the hollow inorganic particles HP may be treated with a coupling agent.

In the display member DP-2 of an embodiment, the low refractive layer LRL may be disposed on a lower portion (e.g., on the bottom) of the color conversion member CCP-2 to change the direction of light which is emitted from the color conversion member CCP-2 and direct it toward an upper portion of the display member DP-2. For example, the low refractive layer LRL may be disposed on a lower portion of the color conversion member CCP-2 to serve an optical extraction function for reflecting the light emitted from the color conversion member CCP-2 back to proceed in an upper direction of the display member DP-2. Accordingly, the display member DP-2 of an embodiment may exhibit improved durability and increased optical efficiency.

However, embodiments of the inventive concept are not limited thereto. Unlike the one shown in the drawings, the low refractive layer LRL may be disposed on an upper portion of the color conversion member CCP-2.

In the display member DP-2 of an embodiment, the color conversion member CCP-2 may include the plurality of color conversion parts CCL1, CCL2, and CCL3 spaced apart from each other on a plane. In addition, the color conversion member CCP-2 may further include the light blocking unit BM disposed between the first to third color conversion parts CCL1, CCL2, and CCL3. In the display member DP-2 of an embodiment, the light blocking unit BM may be disposed corresponding to the pixel defining layer PDL.

The color conversion member CCP-2 may include the color conversion layer CCL composed of the plurality of color conversion parts CCL1, CCL2, and CCL3. As for the color conversion parts CCL1, CCL2, and CCL3 and the light blocking unit BM, the same description of the color conversion parts CCL1, CCL2, and CCL3 and the light blocking unit BM included in the display devices DP and DP-1 of the embodiment described with reference to FIGS. 8-15 may be applied thereto. For example, the color conversion member CCP-2 may include the first converter QD1 for absorbing the first light and wavelength-converting the first light into the second light and the second converter QD2 for absorbing the first light and wavelength-converting the first light into the third light. In addition, the color conversion member CCP-2 may include the first color conversion part CCL1 including the first converter QD1, the second color conversion part CCL2 including the second converter QD2, and the third color conversion part CCL3 for transmitting the first color light.

Between the low refractive layer LRL and the color conversion member CCP-2, the barrier layer BL may further be disposed. The barrier layer BL may be disposed on at least one of the upper portion and the lower portion of the color conversion layer CCL included in the color conversion member CCP-2 to prevent or substantially prevent the color conversion layer CCL from being exposed to moisture/oxygen. Also, the barrier layer BL may cover the color conversion layer CCL.

As for the barrier layer BL, the same contents (e.g., the same descriptions) as those for the barrier layer BL in the display member DP of the embodiment described with reference to FIGS. 8-10 may be applied thereto. That is, the barrier layer BL may include at least one inorganic layer. Also, the color conversion layer CCL may be directly disposed on the low refractive layer LRL. In this case, on the lower surface of the color conversion layer CCL, the barrier layer BL may be omitted.

The display member DP-2 of an embodiment may include the second base substrate BS2. The second base substrate BS2 faces the first base substrate BS1 and may be a member which provides a base surface on which the color conversion member CCP-2 is disposed. The second base substrate BS2 may be a glass substrate, a metal substrate, a plastic substrate, and/or the like. However, embodiments of the inventive concept are not limited thereto, and the second base substrate BS2 may be an inorganic layer, an organic layer, or a composite material layer.

FIG. 19 is a cross-sectional view showing another example of a portion included in the display member DP-2 of the embodiment of FIG. 16, which shows another example of a portion corresponding to the EE region of FIG. 17.

Referring to FIG. 19, a color conversion member (e.g., a color converter) CCP-2a according to an embodiment of the inventive concept is disposed on the low refractive layer LRL, and may include the plurality of color conversion parts CCL1, CCL2, and CCL3 and an optical filter layer FP. The color conversion member CCP-2a may also include the light blocking unit BM and a dam part (e.g., a dam) DM between the color conversion parts CCL1, CCL2, and CCL3. The dam part DM is disposed to overlap the light blocking unit BM and may be disposed between the color conversion parts CCL1, CCL2, and CCL3.

The dam part DM may be formed by utilizing a polymer resin. For example, the dam part DM may be formed by patterning utilizing an acrylic-based resin, an imide-based resin, and/or the like. After the dam part DM is patterned, spaces between the dam parts DM may be filled with the color conversion parts CCL1, CCL2, and CCL3. The dam part DM may distinguish the neighboring color conversion parts CCL1, CCL2, and CCL3 from each other.

The optical filter layer FP may be disposed on the first color conversion part CCL1 and the second color conversion part CCL2. The optical filter layer FP may block the first light and transmit the second and/or third light. That is, the optical filter layer FP may block blue light and transmit green light and red light. The optical filter layers FP1 and FP2 may be disposed on the first and second color conversion parts CCL1 and CCL2, and may not be disposed on the third color conversion part CCL3.

In addition, the optical filter layer FP of the embodiment shown in FIG. 19 may be integrally provided on the first and second color conversion parts CCL1 and CCL2, when compared with the optical filter layers FP1 and FP2 included in the color conversion member CCP-1 of the embodiment described with reference to FIGS. 13 and 14. The optical filter layer FP may be provided to overlap the first color conversion part CCL1, the second color conversion part CCL2, and the light blocking unit BM adjacent thereto. However, embodiments of the inventive concept are not limited thereto. The optical filter layer FP may be provided in plurality while being spaced apart from one another on a plane so as to correspond to each of the first color conversion part CCL1, and the second color conversion part CCL2.

In the embodiment shown in FIG. 19, the reflection layer RP may be disposed between the low refractive layer LRL and the color conversion member CCP-2a. As for the reflection layer RP, the same contents as those for the reflection layer RP included in the display member DP-1 of the embodiment described with reference to FIGS. 11-15 may be applied thereto. For example, the reflection layer RP disposed on a lower portion of the color conversion member CCP-2a of an embodiment may transmit the first light provided from the light source member LP-2, and may reflect the second and third light. The reflection layer RP may be a selective transmissive reflective layer. In addition, unlike the one shown in FIG. 19, the low refractive layer LRL may be directly disposed on a lower portion of the color conversion parts CCL1, CCL2, and CCL3. For example, the low refractive layer LRL may be disposed between the reflection layer RP and the color conversion parts CCL1, CCL2, and CCL3.

FIG. 20 is a cross-sectional view showing another example of a portion included in the display member DP-2 of the embodiment of FIG. 16, i.e., showing another example of a portion corresponding to the EE region of FIG. 17.

Referring to FIG. 20, a color conversion member (e.g., a color converter) CCP-2b according to an embodiment of the inventive concept is disposed on the low refractive layer LRL, and may include the color conversion layer CCL including the plurality of color conversion parts CCL1, CCL2, and CCL3 and a color filter layer CFL disposed on the color conversion layer CCL.

The color filter layer CFL may include a first filter part (e.g., a first filter) CCF1 overlapping the first color conversion part CCL1, a second filter part (e.g., a second filter) CCF2 overlapping the second color conversion part CCL2, and a third filter part (e.g., a third filter) CCF3 overlapping the third color conversion part CCL3.

The color filter layer CFL may reduce or prevent reflection caused by external light.

The color filter layer CFL having the first filter part CCF1, which is a green filter, the second filter part CCF2, which is a red filter, and the third filter part CCF3, which is a blue filter, may transmit light provided from each of the first color conversion part CCL1, the second color conversion part CCL2, and the third color conversion part CCL3, respectively, and block light other than the light provided from a corresponding color conversion part.

Referring to the embodiment shown in FIG. 20, the color conversion member CCP-2a may further include barrier layers BL-1 to BL-2 disposed on the upper portion and the lower portion of the color conversion parts CCL1, CCL2, and CCL3. The barrier layers BL-1 to BL-2 may protect the color conversion parts CCL1, CCL2, and CCL3. As for the barrier layers BL-1 to BL-2, the same contents (e.g., the same descriptions) as those for the barrier layer BL in the display member DP of the embodiment described with reference to FIGS. 8-10 may be applied thereto. That is, the barrier layers BL-1 to BL-2 may include at least one inorganic layer.

A first barrier layer BL-1 may be disposed between the low refractive layer LRL and the color conversion parts CCL1, CCL2, and CCL3, and a second barrier layer BL-2 may be disposed between the color conversion parts CCL1, CCL2, and CCL3 and the color filter layer CFL. At least one of the first barrier layer BL-1 and the second barrier layer BL-2 may be omitted.

In the electronic device DS and the display member DP-2 of an embodiment described with reference to FIGS. 16-20, the low refractive layer LRL was described to be disposed on a lower portion of the color conversion members CCP-2, CCP-2a, and CCP-2b, but embodiments of the inventive concept are not limited thereto. For example, the low refractive layer LRL may be disposed on an upper portion of the color conversion members CCP-2, CCP-2a, and CCP-2b. The low refractive layer LRL may be disposed on the upper portion of the color conversion parts CCL1, CCL2, and CCL3 to increase optical efficiency of light emitted to the outside.

In the electronic device DS and the display member DP-2 of the embodiment described with reference to FIGS. 16-20, the low refractive layer LRL of the embodiment described above with improved strength is included, so that improved durability may be achieved. Also, the low refractive layer LRL is included on the upper portion or the lower portion of the color conversion members CCP-2, CCP-2a, and CCP-2b to increase optical extraction efficiency. That is, the electronic device DS (see FIG. 7) including the display member DP-2 of an embodiment has improved durability and reliability and may exhibit high optical efficiency.

An electronic device of an embodiment includes a low refractive layer in which the ratio of hollow inorganic particles to a matrix part is enhanced (e.g., optimized), thereby exhibiting reliability (e.g., improved reliability). In addition, an electronic device of an embodiment includes the low refractive layer in which the ratio of hollow inorganic particles to a matrix part is enhanced (e.g., optimized) in the display member, thereby exhibiting good optical efficiency and high durability.

A low refractive layer of an embodiment of the inventive concept enhances (e.g., optimizes) the weight ratio of hollow inorganic particles to a matrix part to reduce or minimize the ratio (e.g., amount) of voids inside (e.g., inside the low refractive layer) while maintaining a low refractive index, thereby exhibiting high strength.

An electronic device of an embodiment includes the low refractive layer in which the ratio of hollow inorganic particles to a matrix part is enhanced (e.g., optimized) to exhibit high optical efficiency and color reproducibility, thereby achieving improved display quality.

It will be understood by those skilled in the art that various changes in form and details may be made therein without departing from the spirit and scope of the inventive concept as defined in the appended claims. In addition, the embodiments disclosed in the present inventive concept are not intended to limit the technical spirit of the present inventive concept, and all technical ideas within the scope of the following claims and equivalents thereof should be construed as falling within the scope of the present inventive concept, and equivalents thereof.

What is claimed is:

1. A refractive layer comprising:
   a plurality of hollow inorganic particles; and
   a matrix between the plurality of hollow inorganic particles,
   wherein a weight ratio of the plurality of hollow inorganic particles to the matrix is 4:6 to 7:3,
   wherein each of the plurality of hollow inorganic particles comprises a core and a shell surrounding the core,
   wherein the shell comprises:
      an inorganic layer defining the core and comprising $Fe_3O_4$;
      an organic layer surrounding an outer surface of the inorganic layer; and
      a surface treatment layer on an outer surface of the organic layer and comprising a coupling agent,
   wherein the coupling agent comprises:
      a first end comprising an acrylate group coupled to the organic layer of the shell; and
      a second end comprising a trihydroxysilyl group coupled to the matrix of the refractive layer,
   wherein the core defined by the inorganic layer of the shell is filled with a gas or a liquid, and
   wherein the shell has a thickness of 7 nm to 10 nm.

2. The refractive layer of claim 1, wherein the core is filled with air.

3. The refractive layer of claim 1, wherein the coupling agent is represented by Formula 1 below:

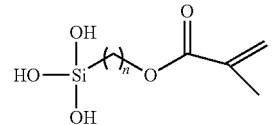

Formula 1 wherein in Formula 1, n is an integer of 1 to 5.

4. The refractive layer of claim 1, wherein
each of the plurality of hollow inorganic particles has an average diameter of 20 nm to 200 nm.

5. The refractive layer of claim 1, wherein
the matrix comprises at least one selected from the group consisting of an acrylic-based polymer, a silicone-based polymer, a urethane-based polymer, and an imide-based polymer.

6. The refractive layer of claim 1, wherein the refractive layer has a transmittance of 95% or greater at a wavelength of 400 nm to 700 nm and a refractive index of 1.1 to 1.5 at a wavelength of 632 nm.

7. An electronic device comprising:
a light source configured to provide a first light;
a color converter on the light source, and comprising a first converter configured to wavelength-convert the first light into a second light and a second converter configured to wavelength-convert the first light into a third light; and
a refractive layer on the light source and on at least one of an upper portion or a lower portion of the color converter, wherein
the refractive layer comprises a plurality of hollow inorganic particles and a matrix between the plurality of hollow inorganic particles, and
a weight ratio of the plurality of hollow inorganic particles to the matrix is 4:6 to 7:3,
wherein each of the plurality of hollow inorganic particles comprises a core and a shell surrounding the core,
wherein the shell comprises:
an inorganic layer defining the core and comprising $Fe_3O_4$;
an organic layer surrounding an outer surface of the inorganic layer; and
a surface treatment layer on an outer surface of the organic layer and comprising a coupling agent,
wherein the coupling agent comprises:
a first end comprising an acrylate group coupled to the organic layer of the shell; and
a second end comprising a trihydroxysilyl group coupled to the matrix of the refractive layer,
wherein the core defined by the inorganic layer of the shell is filled with a gas or a liquid, and
wherein the shell has a thickness of 7 nm to 10 nm.

8. The electronic device of claim 7, wherein the core is filled with air.

9. The electronic device of claim 7, wherein
the first light is blue light,
the first converter comprises a first quantum dot configured to covert the blue light into green light, and
the second converter comprises a second quantum dot configured to convert the blue light into red light.

10. The electronic device of claim 7, further comprising a display element on the color converter.

11. The electronic device of claim 10, wherein the display element is a liquid crystal display.

12. The electronic device of claim 10, wherein
the light source comprises:
a guide panel; and
a light source unit on at least one side of the guide panel, and
the refractive layer is between the guide panel and the color converter.

13. The electronic device of claim 12, wherein
the refractive layer is directly on the guide panel.

14. The electronic device of claim 12, further comprising a barrier layer on at least one of an upper surface or a lower surface of the color converter.

15. The electronic device of claim 7, wherein
the color converter comprises a plurality of color conversion parts spaced apart from each other on a plane, and
the plurality of color conversion parts comprises:
a first color conversion part comprising the first converter;
a second color conversion part comprising the second converter; and
a third color conversion part configured to transmit the first light.

16. The electronic device of claim 15, wherein
the color converter further comprises a light blocking unit between the first, second and third color conversion parts which are spaced apart from each other.

17. The electronic device of claim 15, further comprising a reflection layer on at least one of an upper portion or a lower portion of the plurality of color conversion parts, and configured to transmit the first light and reflect the second light and the third light.

18. The electronic device of claim 17, wherein
the refractive layer is between the reflection layer and the plurality of color conversion parts, and configured to cover the plurality of color conversion parts.

19. The electronic device of claim 17, wherein
the reflection layer is between the refractive layer and the plurality of color conversion parts, and configured to cover the plurality of color conversion parts.

20. The electronic device of claim 15, wherein
the color converter further comprises a barrier layer on at least one of an upper portion or a lower portion of the plurality of color conversion parts.

21. The electronic device of claim 20, wherein
the barrier layer is between the refractive layer and the plurality of color conversion parts, and configured to cover the plurality of color conversion parts.

22. The electronic device of claim 15, wherein
the color converter further comprises an optical filter layer configured to transmit at least one of the second light or the third light.

23. The electronic device of claim 22, wherein
the optical filter layer comprises:
a first optical filter layer on the first color conversion part; and
a second optical filter layer on the second color conversion part.

24. The electronic device of claim 23, wherein
the first optical filter layer is configured to transmit green light, and the second optical filter layer is configured to transmit red light.

25. The electronic device of claim 15, further comprising:
a first base substrate and a second base substrate on the light source, the second base substrate facing the first base substrate; and
a liquid crystal layer between the first base substrate and the second base substrate,
wherein the color converter is between the liquid crystal layer and the second base substrate.

26. The electronic device of claim 25, wherein
the refractive layer is between the liquid crystal layer and the color converter, or between the color converter and the second base substrate.

27. The electronic device of claim 25, further comprising:
a first polarizing layer between the light source and the first base substrate, or between the first base substrate and the liquid crystal layer; and a second polarizing layer between the liquid crystal layer and the second base substrate.

28. The electronic device of claim 15, wherein the light source comprises an organic electroluminescence element.

29. The electronic device of claim 28, wherein the color converter further comprises a dam configured to separate the plurality of color conversion parts from each other, the dam being between adjacent color conversion parts from among the plurality of color conversion parts.

30. The electronic device of claim 28, wherein the color converter further comprises a color filter layer on the plurality of color conversion parts, and the color filter layer comprises:

a plurality of filters configured to emit light of different colors; and a light blocking unit configured to separate the plurality of filters from each other, the light blocking unit being between adjacent filters from among the plurality of filters.

* * * * *